United States Patent
Hasegawa et al.

(10) Patent No.: US 7,911,047 B2
(45) Date of Patent: Mar. 22, 2011

(54) SEMICONDUCTOR DEVICE AND METHOD OF FABRICATING THE SEMICONDUCTOR DEVICE

(75) Inventors: Hidenori Hasegawa, Miyazaki (JP); Norio Takahashi, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 188 days.

(21) Appl. No.: 12/081,740

(22) Filed: Apr. 21, 2008

(65) Prior Publication Data
US 2008/0265395 A1 Oct. 30, 2008

(30) Foreign Application Priority Data

Apr. 27, 2007 (JP) ................................. 2007-119773

(51) Int. Cl.
*H01L 23/49* (2006.01)
*H01L 21/56* (2006.01)

(52) U.S. Cl. ........ 257/690; 257/678; 257/691; 257/698; 257/787; 257/791; 257/E21.499; 257/E23.004; 257/E23.062; 257/E23.069; 257/E23.178; 438/106; 438/108; 438/112; 438/118; 438/612

(58) Field of Classification Search .................. 257/678, 257/690, 691, 698, 787, E21.499, E23.004, 257/E23.062, E23.069, E23.178; 438/106, 438/108, 112, 118, 612
See application file for complete search history.

(56) References Cited

U.S. PATENT DOCUMENTS

| 5,874,321 | A | * | 2/1999 | Templeton et al. | 438/107 |
| 6,876,554 | B1 | * | 4/2005 | Inagaki et al. | 361/763 |
| 6,914,322 | B2 | * | 7/2005 | Iijima et al. | 257/678 |
| 2008/0090335 | A1 | * | 4/2008 | Morimoto et al. | 438/118 |

FOREIGN PATENT DOCUMENTS

| JP | 11-168150 | 6/1999 |
| JP | 2002-158312 | 5/2002 |
| JP | 2003-249604 | 9/2003 |
| JP | 2005-235824 | 9/2005 |
| JP | 2007-294634 | 11/2007 |

* cited by examiner

*Primary Examiner* — Dao H Nguyen
(74) *Attorney, Agent, or Firm* — Rabin & Berdo, PC

(57) ABSTRACT

A semiconductor device includes: a package substrate that includes a recessed portion, with electrode pads that are electrically connected to electrodes of the semiconductor chip being formed inside the recessed portion; a semiconductor chip that is housed in the recessed portion; terminal-use wires that are formed on the surface of the package substrate and are electrically connected to the electrode pads; external connection pads that are formed on a back surface of the package substrate and are electrically connected to the electrode pads; a sealing resin portion that includes a grinded surface that is parallel to the surface of the package substrate, and seals at least the semiconductor chip by a sealing resin; rewiring pads that are formed on the grinded surface; and connecting wires that are formed on the grinded surface and electrically interconnect the terminal-use wires and the rewiring pads.

15 Claims, 26 Drawing Sheets

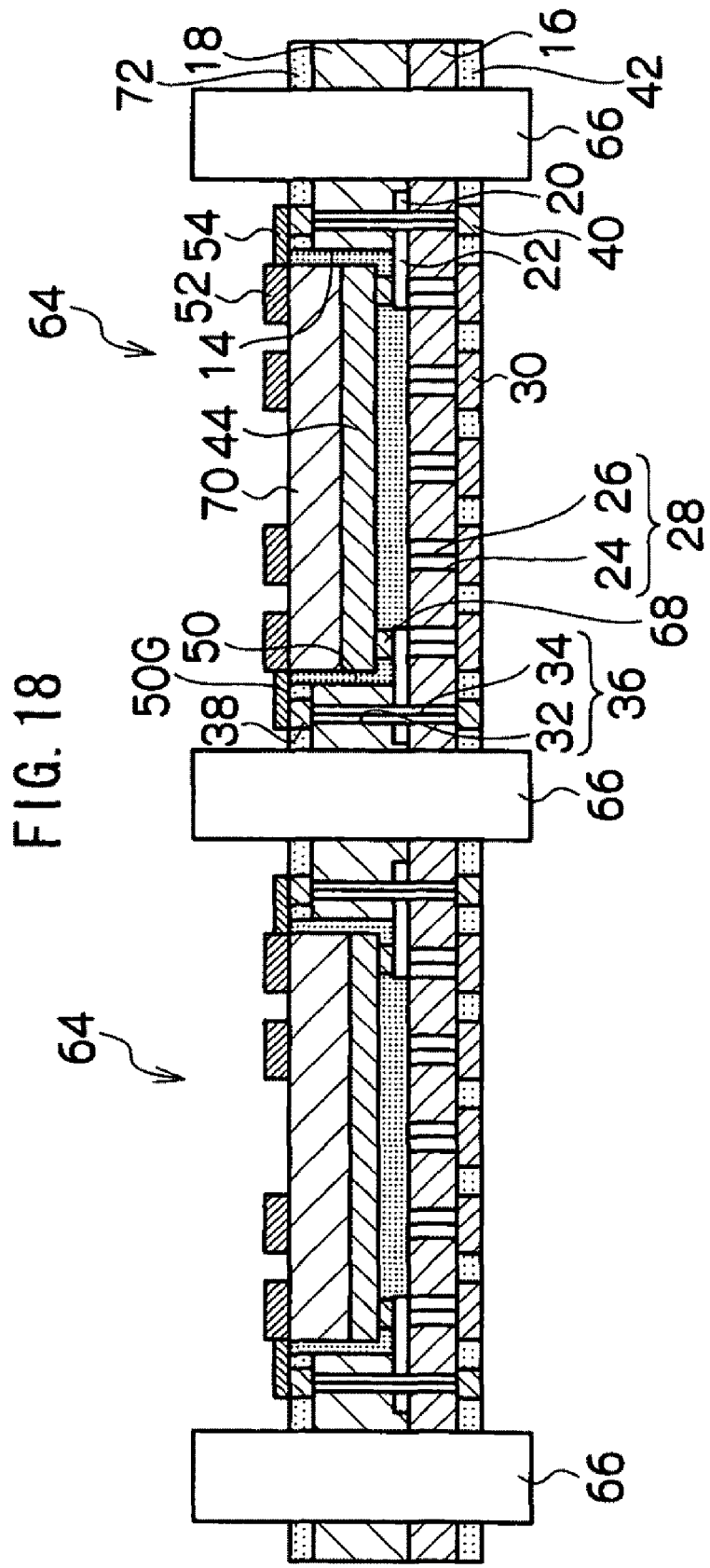

SEMICONDUCTOR DEVICE AND METHOD OF FABRICATING THE SEMICONDUCTOR DEVICE

CROSS-REFERENCE TO RELATED APPLICATION

This application claims priority under 35 USC 119 from Japanese Patent Application No. 2007-119773, the disclosure of which is incorporated by reference herein.

BACKGROUND OF THE INVENTION

1. Field of the Invention

The present invention relates to a semiconductor device and a method of fabricating the semiconductor device, and particularly to a semiconductor device having a double-sided electrode structure and a method of fabricating the semiconductor device.

2. Description of the Related Art

In recent times, the development of three-dimensional package technologies whose packaging density is higher have progressed because of the miniaturization of electronic devices such as mobile telephones. Within three-dimensional package technologies, a method called package-on-package (POP), where another package is laminated on one package, is promising. In POP, a package having a double-sided electrode structure (double-sided electrode package) is used. In a double-sided electrode package, inner wires that are connected to a semiconductor chip, penetrating electrodes that interconnect electrodes on a package surface side and the inner wires, and penetrating electrodes that interconnect electrodes on a package back surface side and the inner wires are necessary.

Conventionally, double-sided electrode packages of various structures have been proposed. For example, in Japanese Patent Application Publication (JP-A) No. 2002-158312, there is described a resin-sealed type double-sided electrode package. In this double-sided electrode package, penetrating electrodes are disposed in a sealing resin layer that seals a semiconductor chip, and electrodes on a surface side and inner wires are interconnected via these penetrating electrodes.

Further, in JP-A No. 2003-249604, there is described a lead frame type double-sided electrode package. In this package, part of an inner lead is exposed to the outside of a resin sealing material, and a surface and a back surface of the inner lead are used as external electrodes. Here, the inner lead plays the role of a penetrating electrode.

Further, in JP-A No. 2005-235824, there is described a ball grid array (BGA) type double-sided electrode package. In this package, stepped portions are disposed in a package substrate, end portions of wire bonding-use electrodes are exposed to these stepped portions, and these end portions and electrodes on a surface side or a back surface side are interconnected by penetrating electrodes that penetrate the package substrate.

In order to package these double-sided electrode packages in high density, it is necessary to thin the individual packages. For example, in JP-A No. 2005-235824, the stepped portions are disposed in the package substrate, and the package substrate is mechanically grinded from the back surface side to thereby thin the package.

However, the structure of a conventional double-sided electrode package is not one where electrodes on the surface side are arranged in an arbitrary layout, and it lacks the flexibility of interconnecting upper and lower packages. Further, the sealing resin layer is formed by transfer, but in transfer, it has been difficult to thinly form the sealing resin layer because molding is performed using a mold.

SUMMARY OF THE INVENTION

A first aspect of the present invention provides a semiconductor device comprising: a package substrate that includes, in a surface side thereof, a recessed portion in which a semiconductor chip is housed, with electrode pads that are electrically connected to electrodes of the semiconductor chip being formed inside the recessed portion; a semiconductor chip that is housed in the recessed portion; terminal-use wires that are formed on the surface of the package substrate and are electrically connected to the electrode pads; external connection pads that are formed on a back surface of the package substrate and are electrically connected to the electrode pads; a sealing resin portion that includes a grinded surface that is parallel to the surface of the package substrate and is formed by grinding, and seals at least the semiconductor chip by a sealing resin; rewiring pads that are formed on the grinded surface of the sealing resin portion; and connecting wires that are formed on the grinded surface of the sealing resin portion and electrically interconnect the terminal-use wires and the rewiring pads.

In this semiconductor device, the resin sealing portion may seal the semiconductor chip and the electrode pads by a sealing resin. Further, the grinded surface can be formed by grinding a sealing resin that has been molded so as to fill a gap between the recessed portion and the semiconductor chip and cover the surface of the package substrate such that the grinded surface becomes parallel to the surface of the package substrate.

Further, in this semiconductor device, the sealing resin can be grinded until the terminal-use wires are exposed, and the grinded surface and surfaces of the terminal-use wires can be given the same height. Or, the sealing resin may be grinded as far as the tops of the terminal-use wires, the surface of the package substrate may be covered by the sealing resin, and the sealing resin on the terminal-use wires may be removed to expose the terminal-use wires.

Further, as the semiconductor chip, a semiconductor chip on whose back surface has been formed an insulating film comprising an insulating material whose heat dissipating ability is higher than that of the sealing resin can be used. In this case, the grinded surface can be formed by grinding a sealing resin that has been molded so as to fill a gap between the recessed portion and the semiconductor chip and cover the surfaces of the package substrate and the insulating film such that the grinded surface becomes parallel to the surface of the package substrate. Further, the sealing resin can be grinded until the terminal-use wires and the insulating film are exposed, and the grinded surface, surfaces of the terminal-use wires, and the surface of the insulating film can be given the same height.

A second aspect of the present invention provides a method of fabricating a semiconductor device, the method comprising: forming, in a frame substrate divided into a plurality of package substrates, recessed portions in which semiconductor chips are housed per package, electrode pads that are electrically connected to electrodes of the semiconductor chips inside the recessed portions, terminal-use wires that are formed on surfaces of the package substrates and are electrically connected to the electrode pads, and external connection pads that are formed on back surfaces of the package substrates and are electrically connected to the electrode pads; housing the semiconductor chips in the recessed portions per package; molding a sealing resin so as to fill gaps between the recessed portions and the semiconductor chips and cover the surfaces of the plurality of package substrates in order to seal the semiconductor chips by a sealing resin; grinding the sealing resin that has been molded to form a grinded surface that is parallel to the surfaces of the package substrates; forming rewiring pads per package on the grinded surface and forming connecting wires that electrically interconnect the terminal-use wires and the rewiring pads; and dicing the frame substrate where the semiconductor chips are housed per package and where the recessed portions, the electrode pads, the terminal-use wires, the external connection pads, the sealing resin, the rewiring pads and the connecting wires are formed per package to thereby divide the frame substrate into individual packages.

BRIEF DESCRIPTION OF THE DRAWINGS

FIG. 18 is a partial cross-sectional diagram showing a dicing process;

DETAILED DESCRIPTION OF THE INVENTION

Below, examples of embodiments of the present invention will be described in detail with reference to the drawings.

First Embodiment (Double-Sided Electrode Package)

Figure 1A:
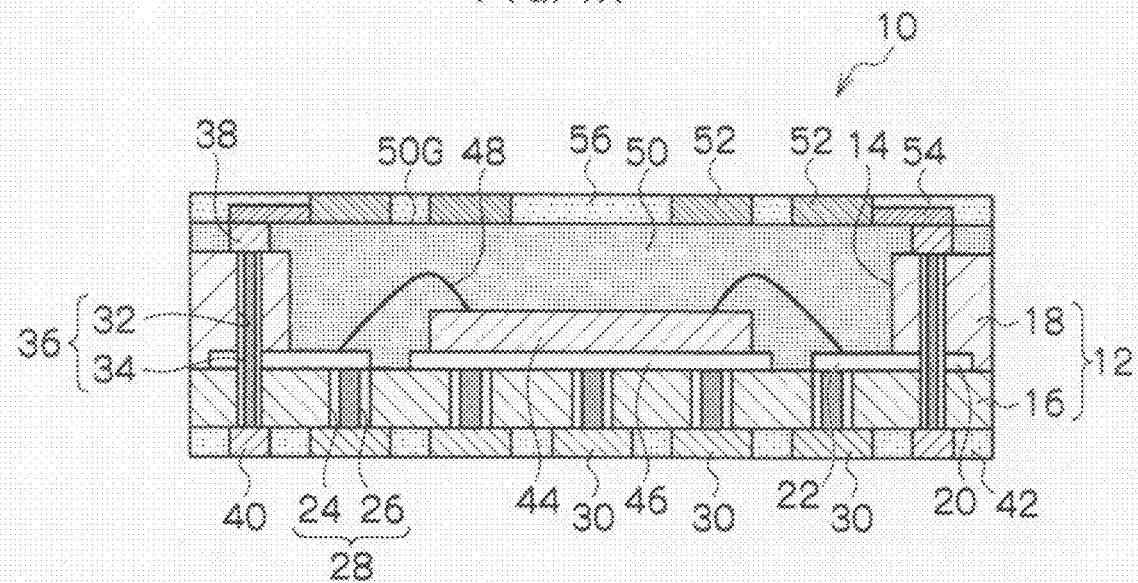
FIG. 1A is a general cross-sectional diagram showing the configuration of a double-sided electrode package pertaining to a first embodiment of the present invention.
Figure 1B:
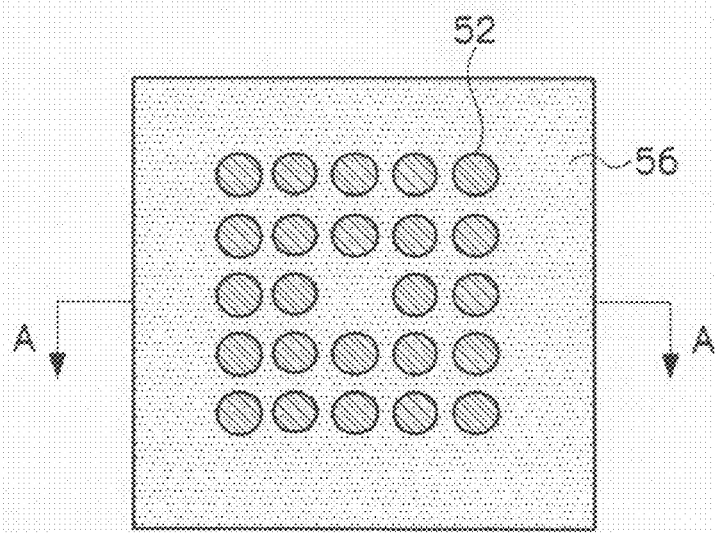
FIG. 1B is a plan diagram of the same double-sided electrode package as seen from a surface side.
Figure 2A:
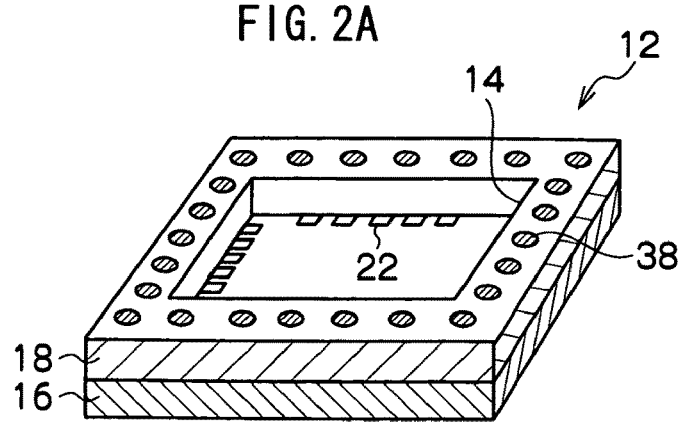
FIG. 2A is a perspective diagram showing the exterior of a package substrate.
Figure 2B:
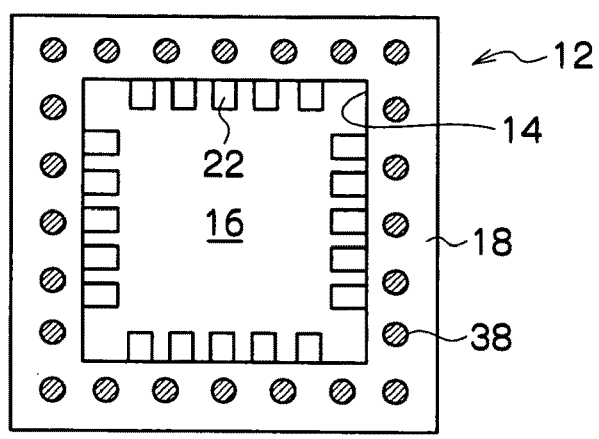
FIG. 2B is a plan diagram of the package substrate as seen from a surface side.
Figure 2C:
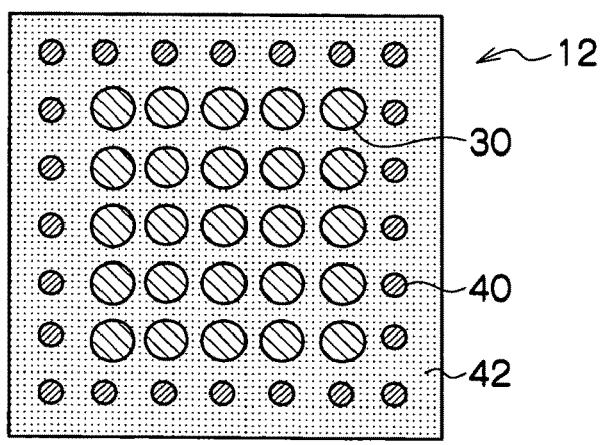
FIG. 2C is a plan diagram of the package substrate as seen from a back surface side.

FIG. 1A is a general cross-sectional diagram showing the configuration of a double-sided electrode package 10 pertaining to a first embodiment of the present invention. FIG. 1B is a plan diagram of the same double-sided electrode package 10 as seen from a surface side. FIG. 1A is a cross-sectional diagram along A-A of FIG. 1B. FIG. 2A is a perspective diagram showing the exterior of a package substrate 12. FIG. 2B is a plan diagram of the package substrate 12 as seen from a surface side. FIG. 2C is a plan diagram of the package substrate 12 as seen from a back surface side.

The double-sided electrode package 10 pertaining to the first embodiment is, as shown in FIG. 2A, disposed with the package substrate 12 that is square when seen in plan view. A cavity 14 that opens to the surface is formed in the package substrate 12. The cavity 14 is, as shown in FIG. 2B, square when seen in plan view, and the open diameter thereof is larger than the planar size of a semiconductor chip. Further, the package substrate 12 is configured by a tabular core material 16, which is configured by an insulator such as a resin or ceramic, and an insulating layer 18, which is laminated on the core material 16. The insulating layer 18 is formed in a square frame shape so as to surround the square cavity 14.

Wires 20 are formed in a predetermined pattern between the core material 16 and the insulating layer 18. As shown in FIG. 2B, one end of each of the wires 20 is exposed together with the core material 16 on the bottom surface of the cavity 14. The exposed portions of these wires 20 become bonding pads 22 for wire bonding. Via holes 24 that penetrate the core material 16 are plurally formed in the core material 16. The inside of each of the via holes 24 is filled with a conductive material 26 so as to form penetrating electrodes 28.

One end of each of the penetrating electrodes 28 is exposed to the surface of the core material 16, and the other end of each of the penetrating electrodes 28 is exposed to the back surface of the core material 16. Electrode pads 30 for external connection are plurally formed on the back surface of the package substrate 12 so as to cover the exposed portions of the penetrating electrodes 28. The ends of the penetrating electrodes 28 exposed to the surface of the core material 16 are electrically connected to the wires 20, and the other ends of the penetrating electrodes 28 exposed to the back surface of the core material 16 are electrically connected to the electrode pads 30.

Further, via holes 32 that penetrate the core material 16 and the insulating layer 18 are plurally formed in the package substrate 12. The inside of each of the via holes 32 is filled with a conductive material 34 so as to form penetrating electrodes 36. One end of each of the penetrating electrodes 36 is exposed to the surface of the insulating layer 18, and the other end of each of the penetrating electrodes 36 is exposed to the back surface of the core material 16. As shown in FIG. 2A and FIG. 2B, lands 38 that are terminal-use wires are plurally formed on the surface of the package substrate 12 (the surface of the insulating layer 18). Further, lands 40 are also plurally formed on the back surface of the package substrate 12 (the back surface of the core material 16).

In the present embodiment, as shown in FIG. 2A and FIG. 2B, there are twenty-four of the lands 38 formed on the insulating layer 18 that is formed in the frame shape of the package substrate 12, such that there are seven of the lands 38 lined up one each side. Further, as shown in FIG. 2C, there are twenty-four of the lands 40 arrayed on the back surface of the package substrate 12 so as to face the lands 38 and such that there are seven of the lands 40 lined up on each side. It will be noted that the number of the lands 38 and the number of the lands 40 can be appropriately changed in accordance with the number of electrodes of a later-described semiconductor chip 44.

The ends of the penetrating electrodes 36 exposed to the surface of the package substrate 12 are electrically connected to the lands 38, and the other ends of the penetrating electrodes 36 exposed to the back surface of the package substrate 12 are electrically connected to the lands 40. Further, the penetrating electrodes 36 are also electrically connected to the wires 20 at the surface of the core material 16. Further, as shown in FIG. 2C, the back surface of the package substrate 12 is covered by a solder resist 42 so as to leave the electrode pads 30 and the lands 40.

A semiconductor chip 44 such as an LSI chip is housed in the cavity 14 of the package substrate 12. The back surface of the semiconductor chip 44 is adhered to the bottom surface of the cavity 14 by a die-bond material 46. Plural unillustrated electrodes are formed on the surface of the semiconductor chip 44. Metal wires 48 are looped between the electrodes of the semiconductor chip 44 and the bonding pads 22, and the semiconductor chip 44 is wire-bonded to the package substrate 12. That is, one end of each of the metal wires 48 is electrically connected to the electrodes of the semiconductor chip 44, and the other end of each of the metal wires 48 is electrically connected to the bonding pads 22.

The inside of the cavity 14 is filled with a sealing resin 50 so as to fill a gap between the package substrate 12 and the semiconductor chip 44. The semiconductor chip 44 inside the cavity 14 is sealed by the sealing resin 50. Similarly, the bonding pads 22 and the metal wires 28 are also sealed by the sealing resin 50. The surface of the sealing resin 50 is, as described later, given the same height (same surface) as the surfaces of the lands 38 by grinding, from the surface, a resin layer that has been molded so as to cover the semiconductor chip 44. For this reason, the surface of the package substrate 12 is covered by the sealing resin 50 so as to leave the lands 38. Further, the surface of the sealing resin 50 is a grinded surface 50G formed by grinding.

Plural rewiring pads 52 are formed on the grinded surface 50G of the sealing resin 50. In FIG. 1B, there are twenty-four of the rewiring pads 52 arranged in a 5×5 matrix excluding one in the center. It will be noted that the number of the rewiring pads 52 can be appropriately changed in accordance with the number of the lands 38 and the like.

Further, as mentioned above, in the present embodiment, there are twenty-four of the lands 38 formed on the surface of the package substrate 12. Wires 54 that interconnect these lands 38 and the rewiring pads 52 in a one-to-one ratio are formed on the grinded surface 50G of the sealing resin 50, and rewiring is performed on the surface of the sealing resin 50. Further, as shown in FIG. 1B, the surface of the double-sided electrode package 10 is covered by a solder resist 56 so as to leave just the rewiring pads 52.

(Method of Fabricating Double-Sided Electrode Package)

Next, a method of fabricating the double-sided electrode package 10 will be described. FIG. 3A to FIG. 10B are diagrams showing processes of fabricating the double-sided electrode package 10 pertaining to the first embodiment. In these fabrication processes, as shown in FIG. 3A to FIG. 10B, a single frame substrate 60, on which a plurality of the package substrates 12 have been formed, is used. A double-sided electrode package structure is formed per package substrate on this frame substrate 60. Finally, the frame substrate 60 is diced to thereby divide the frame substrate 60 into individual double-sided electrode packages. Below, the processes of fabricating the double-sided electrode packages will be described in order.

(Process of Preparing Frame Substrate)

First, a single frame substrate 60, on which a plurality of the package substrates 12 have been formed, is prepared.

Figure 3A:
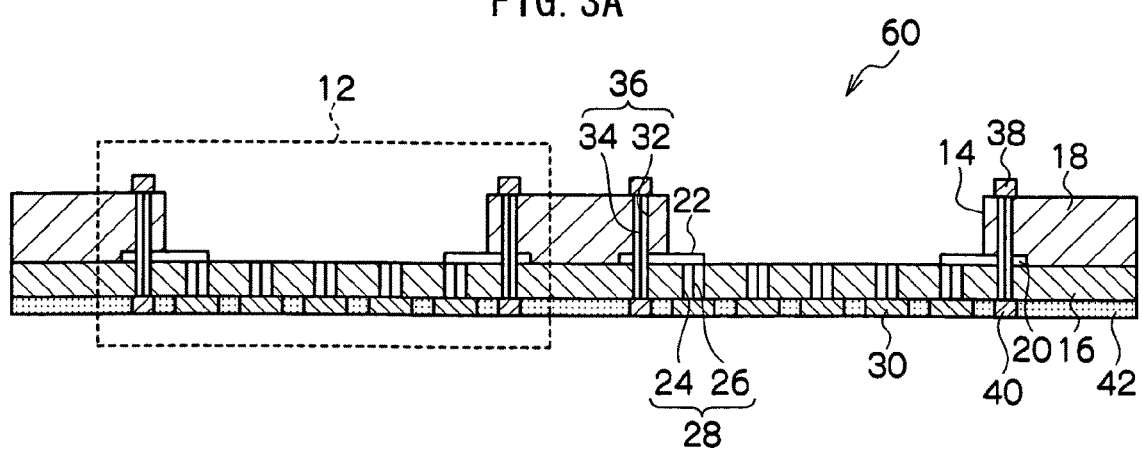
FIG. 3A and FIG. 3B are diagrams showing a process of preparing a frame substrate, with FIG. 3A being a partial cross-sectional diagram and FIG. 3B being a plan diagram as seen from a surface side.
Figure 3B:
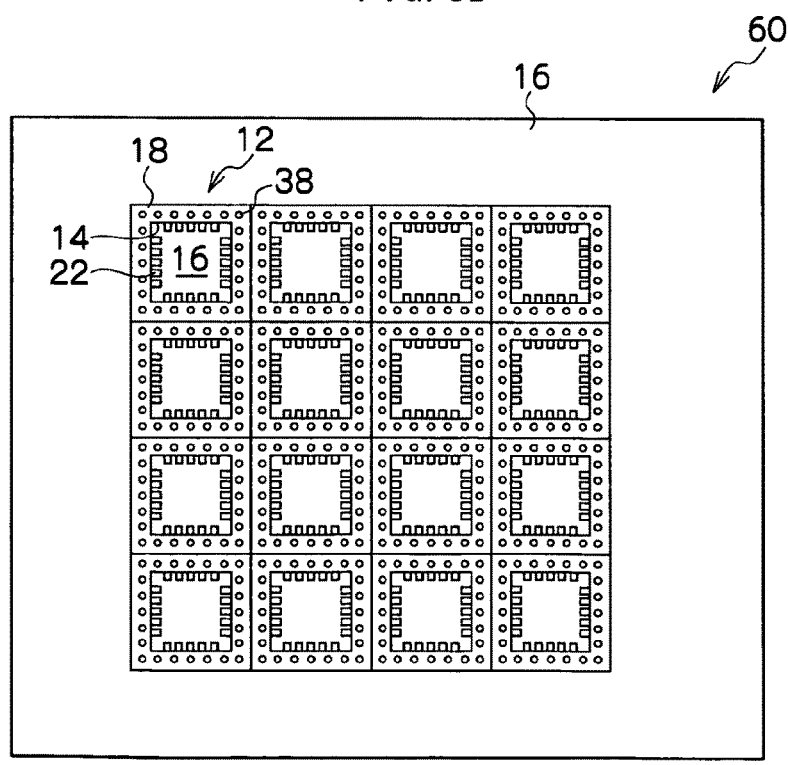

FIG. 3A and FIG. 3B are diagrams showing the process of preparing the frame substrate 60. FIG. 3A is a partial cross-sectional diagram of the frame substrate 60, and FIG. 3B is a plan diagram of the frame substrate 60 as seen from a surface side.

A plurality of the package substrates 12 are formed on the frame substrate 60. Here, as shown in FIG. 3B, part of the frame substrate 60 is illustrated. There are sixteen of the package substrates 12 arranged in a 4×4 matrix on the illustrated portion of the frame substrate 60. It will be noted that FIG. 3A illustrates just a portion including two of the package substrates 12. The portion enclosed by the dotted line corresponds to one package substrate 12 that is shown in FIG. 2A to FIG. 2C.

The frame substrate 60 is disposed with the tabular core material 16 and the insulating layer 18 that is laminated on the core material 16. The insulating layer 18 is formed so as to surround the cavities 14 of the individual package substrates 12. By disposing the insulating layer 18 around each of the cavities 14, a plurality of the cavities 14 can be formed in the frame substrate 60 similarly to when a recessing treatment is performed. In the example shown in FIG. 3B, there are sixteen of the cavities 14 formed in the frame substrate 60.

As has been described already, each of the package substrates 12 is disposed with the wires 20 that are formed between the core material 16 and the insulating layer 18, the bonding pads 22 that are exposed to the bottom surface of the cavity 14, the penetrating electrodes 28, the electrode pads 30, the penetrating electrodes 36, the lands 38, the lands 40 and the solder resist 42.

It is preferred that the core material 16, the insulating layer 18 and the solder resist 42 are configured by an organic resin. For example, the insulating layer 18 can be formed by thermo-compressing, on the core material 16, a sheet (prepreg) formed by impregnating glass fiber with an epoxy resin and allowing the epoxy resin to harden. Further, it is preferred that conductive members such as the wires 20, the bonding pads 22, the conductive material 26 filling the via holes 24 of the penetrating electrodes 28, the electrode pads 30, the conductive material 34 filling the via holes 32 of the penetrating electrodes 36, the lands 38 and the lands 40 are configured by a conductor whose electrical resistance is low, such as copper (Cu).

(Process of Arranging Semiconductor Chips)

Figure 4A:
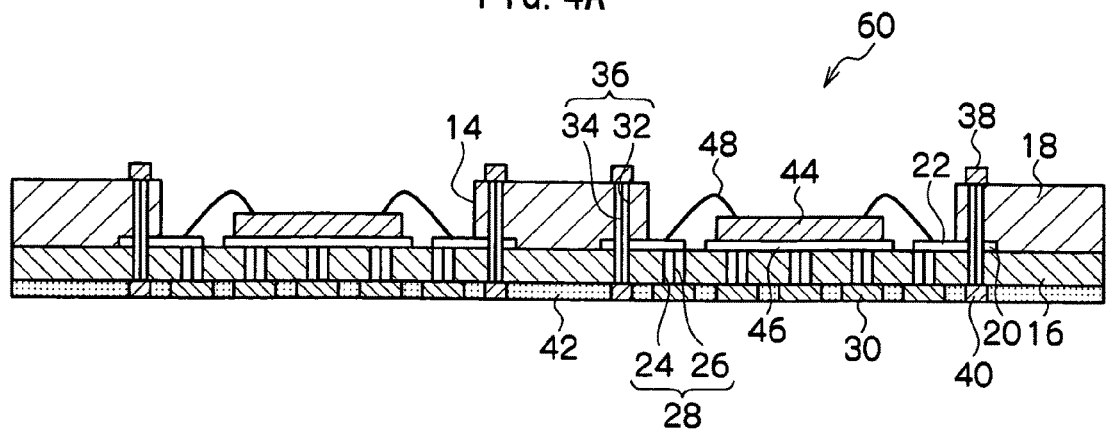
FIG. 4A and FIG. 4B are diagrams showing a process of arranging semiconductor chips, with FIG. 4A being a partial cross-sectional diagram and FIG. 4B being a plan diagram as seen from a surface side.
Figure 4B:
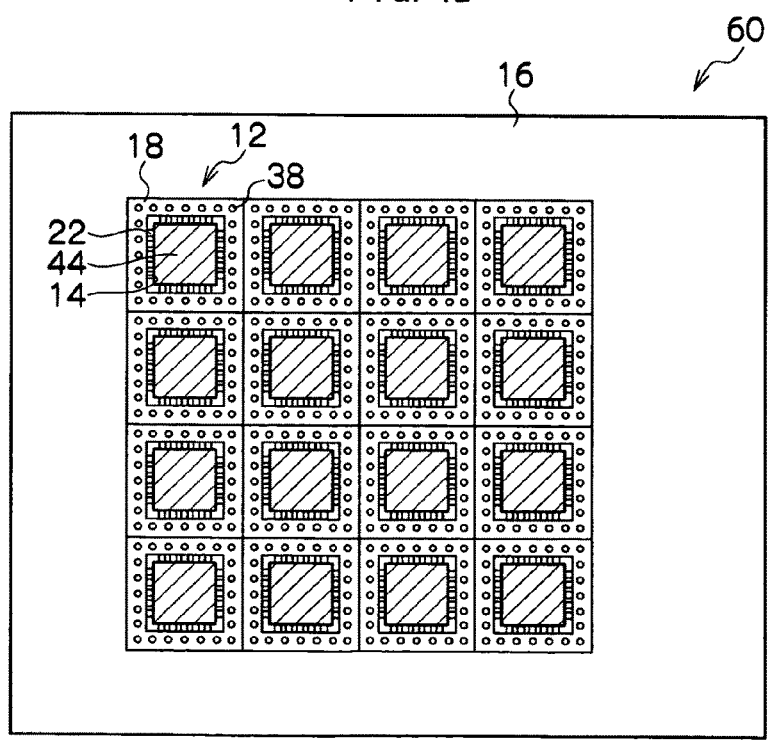

Next, the semiconductor chips 44 are housed in the cavities 14 of the individual package substrates 12. FIG. 4A and FIG. 4B are diagrams showing the process of arranging the semiconductor chips 44. FIG. 4A is a partial cross-sectional diagram of the frame substrate 60, and FIG. 4B is a plan diagram of the frame substrate 60 as seen from a surface side.

The semiconductor chips 44, which comprise IC chips or LSI chips, are made by dividing (dicing), into individual circuits, a semiconductor wafer on which the same circuit has been plurally formed. Although they are not illustrated, plural electrodes are disposed on the surface of each of the semiconductor chips 44. The die-bond material 46 for fixing the chips is applied to chip placement regions on the bottom surfaces of the cavities 14. The die-bond material 46 is an insulating adhesive material; for example, an adhesive sheet or the like can be used. Using this die-bond material 46, the back surfaces of the semiconductor chips 44 are adhered to the bottom surfaces of the cavities 14. Thus, the semiconductor chips 44 are fixed to the bottom surfaces of the cavities 14. As shown in FIG. 4B, the semiconductor chips 44 are fixed in the sixteen cavities 14 of the frame substrate 60.

Next, using a bonding device such as a wire bonder, for example, the electrodes disposed on the surfaces of the semiconductor chips 44 and the bonding pads 22 are wire-bonded by the metal wires 48. As the metal wires 48, fine wires of gold (Au) can be used. As shown in FIG. 4A, the metal wires 48 are looped between the semiconductor chips 44 and the bonding pads 22. At this time, the loop height of the metal wires 48 is lower than the surfaces of the package substrates 12 (the surfaces of the insulating layers 18).

(Process of Sealing Semiconductor Chips)

Next, the semiconductor chips 44 are sealed by a sealing resin.

Figure 5A:
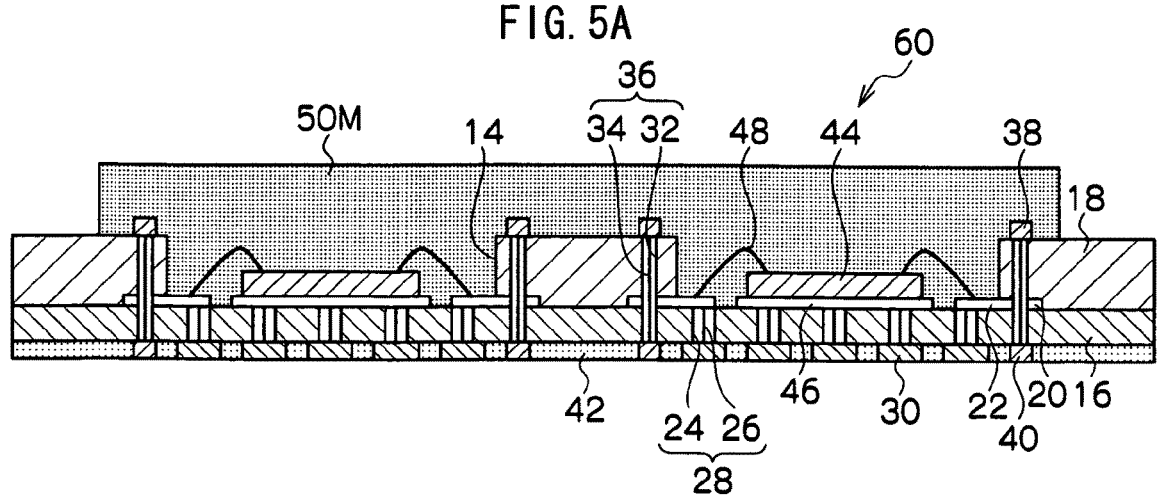
FIG. 5A and FIG. 5B are diagrams showing a process of sealing the semiconductor chips, with FIG. 5A being a partial cross-sectional diagram and FIG. 5B being a plan diagram as seen from a surface side.
Figure 5B:
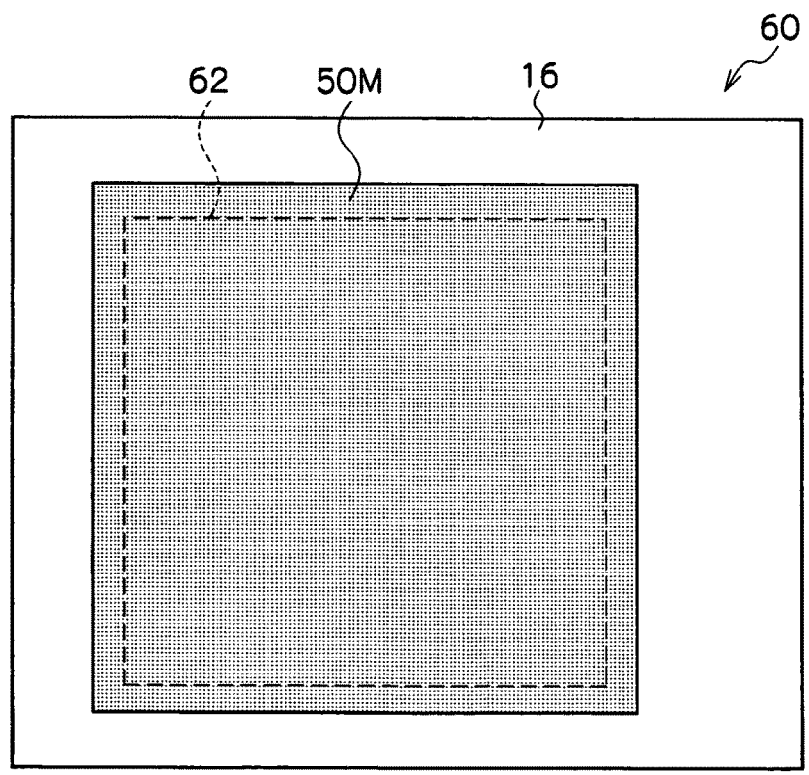

FIG. 5A and FIG. 5B are diagrams showing the process of sealing the semiconductor chips 44. FIG. 5A is a partial cross-sectional diagram of the frame substrate 60, and FIG. 5B is a plan diagram of the frame substrate 60 as seen from a surface side.

The sealing by the sealing resin is performed by transfer, in which the frame substrate 60 where the semiconductor chips 44 are housed in the individual cavities 14 is set in an unillustrated mold. The sealing resin is injected into and fills the inside of this mold, whereby the surface of the frame substrate 60 is covered by a sealing resin 50M. A range that is wider than a region 62 (indicated by the dotted line) where the plural package substrates 12 are formed is covered by the sealing resin 50M. As the sealing resin, an epoxy resin can be used. The sealing resin fills the mold so as to fill gaps between the semiconductor chips 44 and the frame substrate 60. Further, the surface of the frame substrate 60 is covered by the sealing resin 50M such that the lands 38 formed on the surfaces of the package substrates 12 are covered.

After the end of molding, the frame substrate 60 is removed from the mold, and the sealing process ends. The surface of the frame substrate 60 is covered by the sealing resin 50M, whereby the bonding pads 22 and the metal wires 48 are also simultaneously sealed together with the semiconductor chips 44. Further, a range that is wider than the region 62 is covered by the sealing resin 50M, whereby the semiconductor chips 44 housed in the individual cavities 14 are collectively sealed.

(Process of Grinding Sealing Resin)

Next, the sealing resin 50M is grinded from the surface side.

Figure 6A:
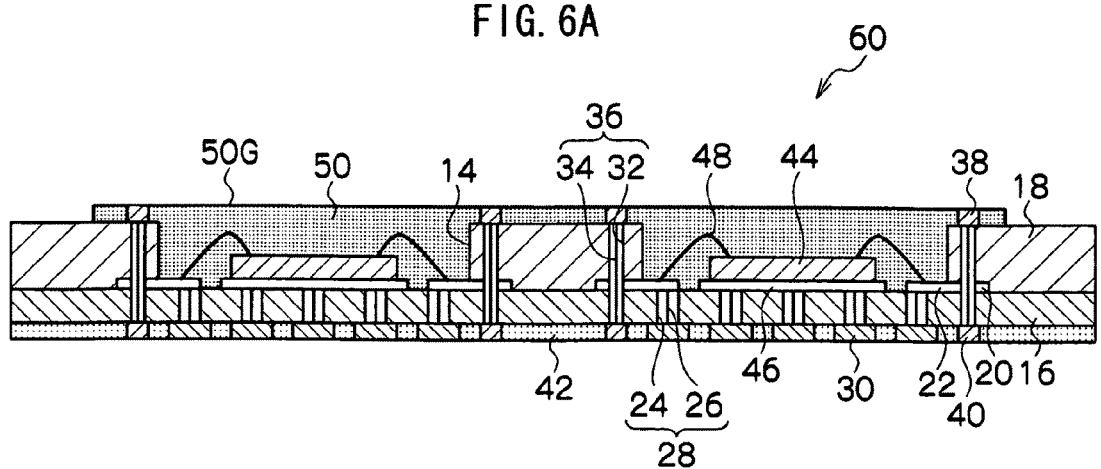
FIG. 6A and FIG. 6B are diagrams showing a process of grinding a sealing resin, with FIG. 6A being a partial cross-sectional diagram and FIG. 6B being a plan diagram as seen from a surface side.
Figure 6B:
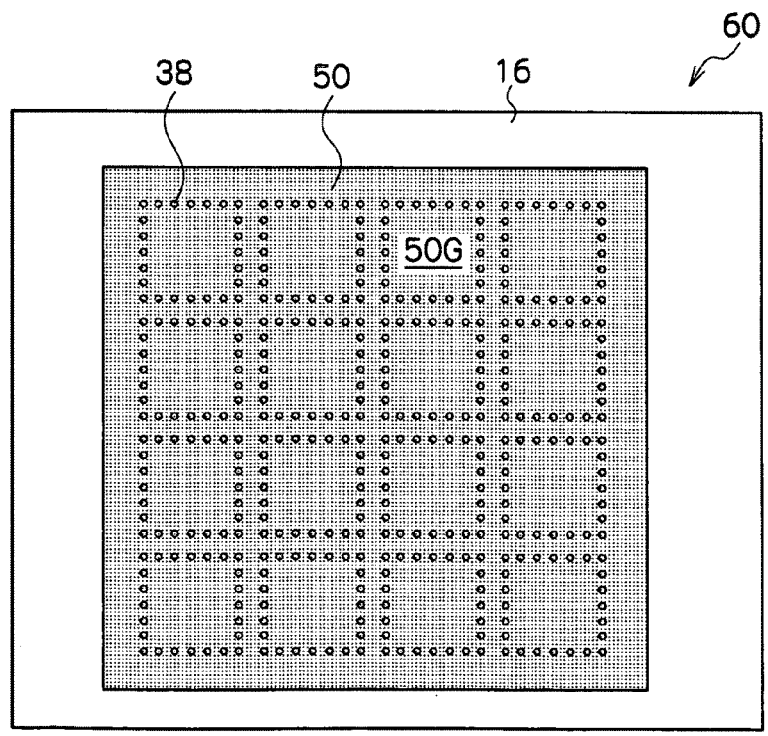

FIG. 6A and FIG. 6B are diagrams showing the process of grinding the sealing resin 50M. FIG. 6A is a partial cross-sectional diagram of the frame substrate 60, and FIG. 6B is a plan diagram of the frame substrate 60 as seen from a surface side.

After the surface of the frame substrate 60 has been covered by the sealing resin 50M, a grinding device such as a grinder is used to grind the sealing resin 50M from the surface side until the lands 38 are exposed. A grinded surface 50G with the same height (same surface) as the surfaces of the lands 38 is formed on the surface of the sealing resin 50. The grinded surface 50G becomes parallel to the surfaces of the package substrates 12 (the surfaces of the insulating layers 18). As a result, as shown in FIG. 6B, the plural lands 38 are exposed to the grinded surface 50G of the sealing resin 50.

In order to form a thin sealing resin layer by conventional transfer, advanced mold creating technology becomes necessary. In contrast, in the present invention, the molded sealing resin 50M is grinded from the surface side, whereby a thin sealing resin layer can be formed and thinning of the double-sided electrode packages can be realized extremely easily. Further, the surface of the frame substrate 60 is, excluding the lands 38, uniformly covered by the sealing resin 50. Consequently, it is difficult for stripping of resin to occur in comparison to when the surface of the frame substrate 60 is covered by plural types of resins whose rates of thermal expansion and rates of thermal contraction are different.

(Rewiring Process)

Next, rewiring is performed on the grinded surface 50G of the sealing resin 50.

Figure 7A:
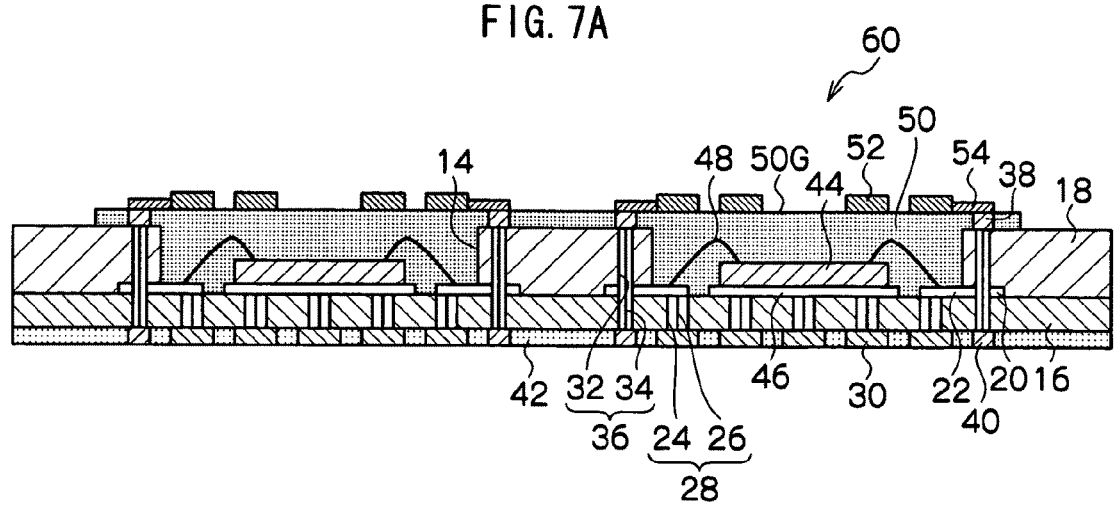
FIG. 7A and FIG. 7B are diagrams showing a rewiring process, with FIG. 7A being a partial cross-sectional diagram and FIG. 7B being a plan diagram as seen from a surface side.
Figure 7B:
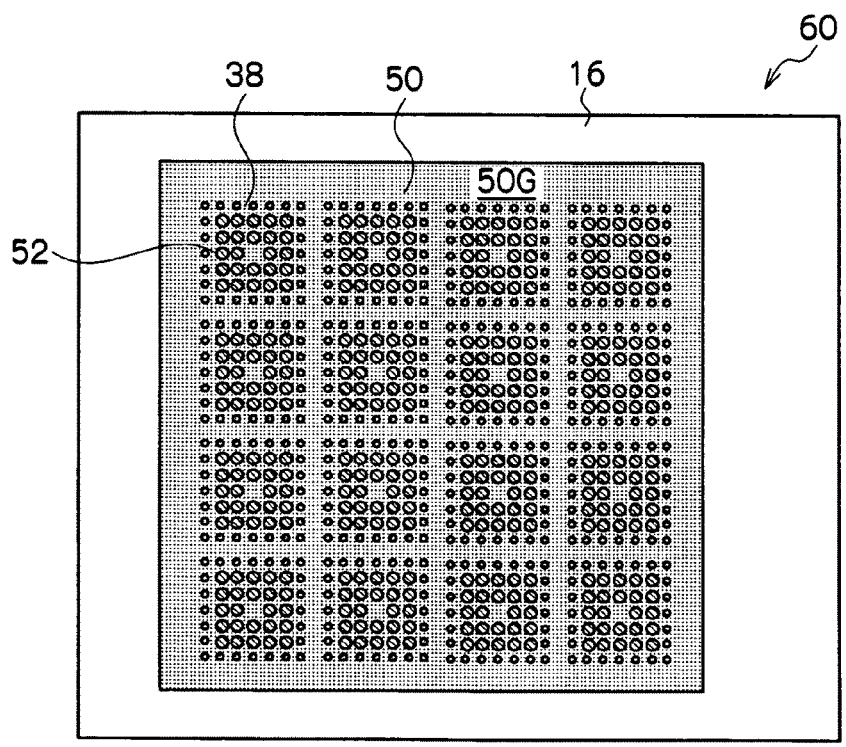
Figure 8:
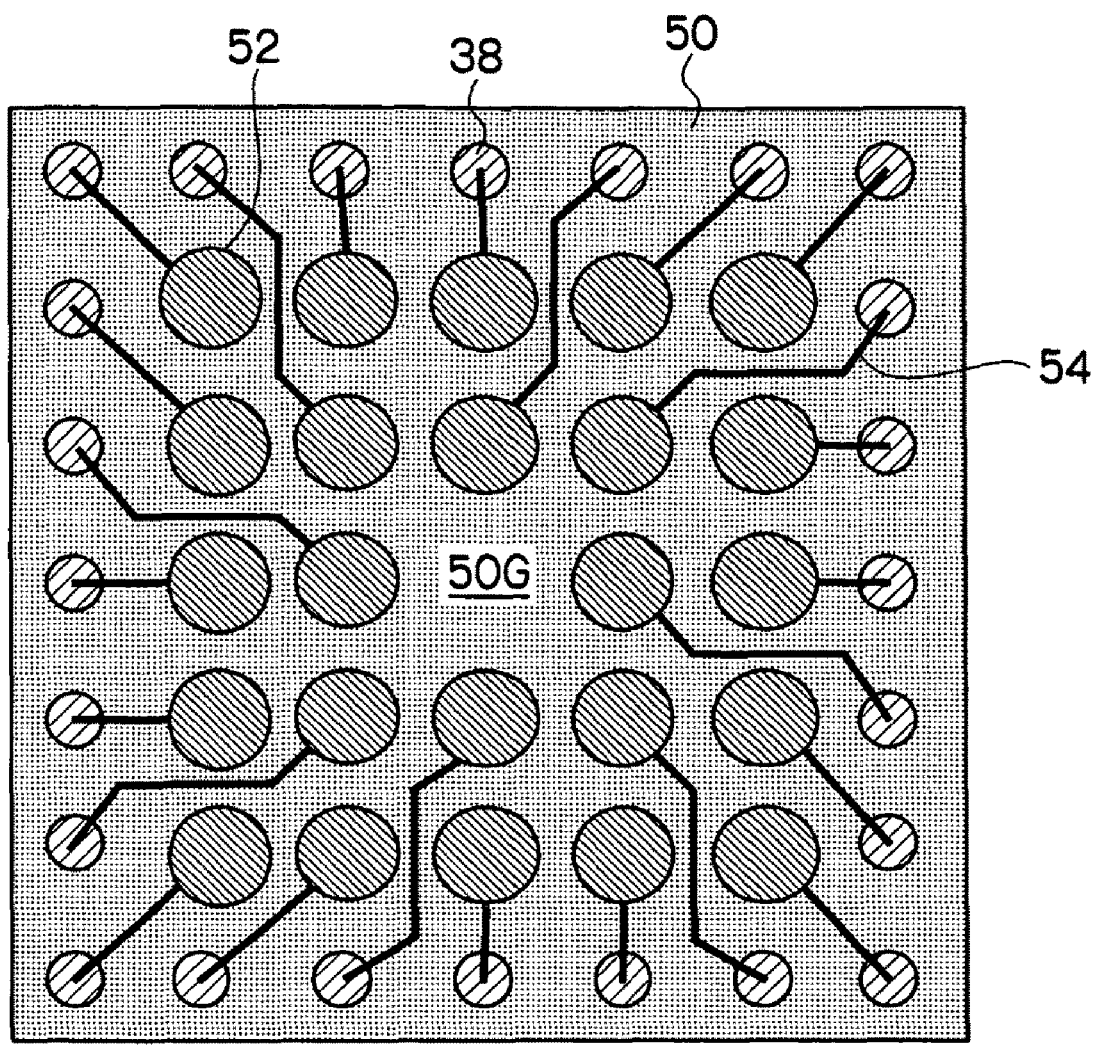
FIG. 8 is a plan diagram showing a rewiring pattern in regard to one package.

FIG. 7A and FIG. 7B are diagrams showing the rewiring process. FIG. 7A is a partial cross-sectional diagram of the frame substrate 60, and FIG. 7B is a plan diagram of the frame substrate 60 as seen from a surface side. FIG. 8 is a plan diagram showing a rewiring pattern in regard to one package.

The rewiring pads 52 and the wires 54 are formed in a predetermined pattern by metal nanoparticles on the grinded surface 50G of the sealing resin 50. In the present embodiment, because the surfaces of the lands 38 and the grinded surface 50G are formed in the same height (same surface), formation of the rewiring pattern is easy. Further, because the grinded surface 50G is a rough surface, the grinded surface 50G has excellent adhesion to the rewiring pads 52 and the wires 54.

In the present embodiment, as shown in FIG. 2A and FIG. 2B, there are twenty-four of the lands 38 arrayed on the insulating layer 18 formed in the frame shape of one package substrate 12 such that there are seven of the lands 38 lined up on each side. For example, as shown in FIG. 1B, twenty-four of the rewiring pads 52 can be formed on the grinded surface 50G in regard to one package substrate 12 in accordance with the number of the lands 38.

The rewiring pads 52 can be arranged (rewired) in an arbitrary layout on the grinded surface 50G such that connection to a package laminated on top becomes easy. For example, in the rewiring pattern shown in FIG. 8, there are twenty-four of the rewiring pads 52 arranged in a 5×5 matrix excluding one in the center. As shown in FIG. 8, the wires 54 are formed so as to interconnect these lands 38 and the rewiring pads 52 in a one-to-one ratio.

The metal nanoparticles are metal particles whose particle diameter is about 1 to 100 nm. As the metal nanoparticles, copper nanoparticles, for example, can be used. Further, the rewiring pattern can be formed by inkjet printing using ink including the metal nanoparticles or screen printing using paste including the metal nanoparticles. When ink or paste including the metal nanoparticles is used, reduction using atomic hydrogen is implemented after the rewiring pattern has been formed to remove dirt and oxides resulting from an organic solvent or the like.

(Process of Forming Resist Film)

Next, the solder resist 56 is applied to the surface side of the frame substrate 60.

Figure 9A:
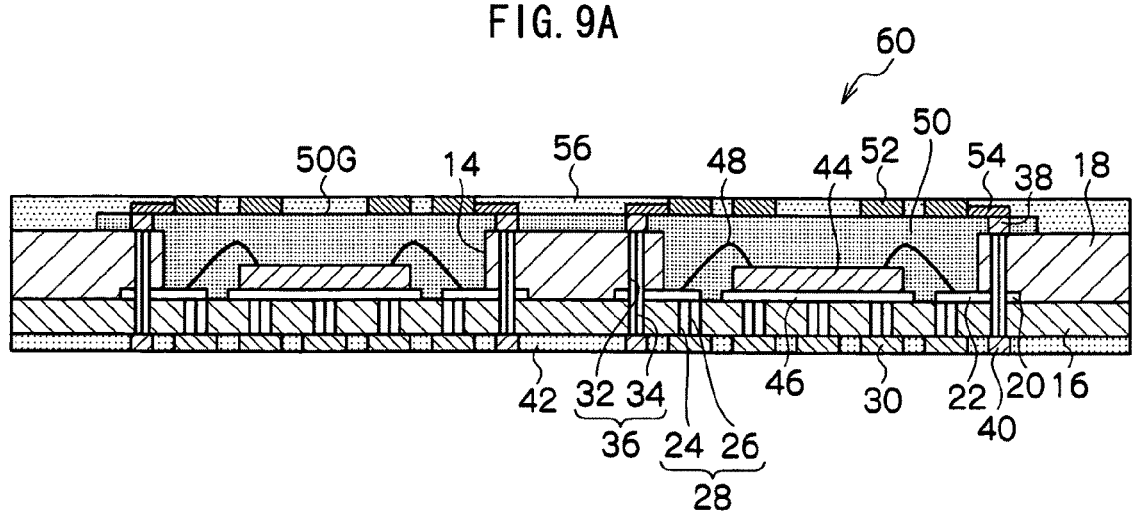
FIG. 9A and FIG. 9B are diagrams showing a process of forming a resist film, with FIG. 9A being a partial cross-sectional diagram and FIG. 9B being a plan diagram as seen from a surface side.
Figure 9B:
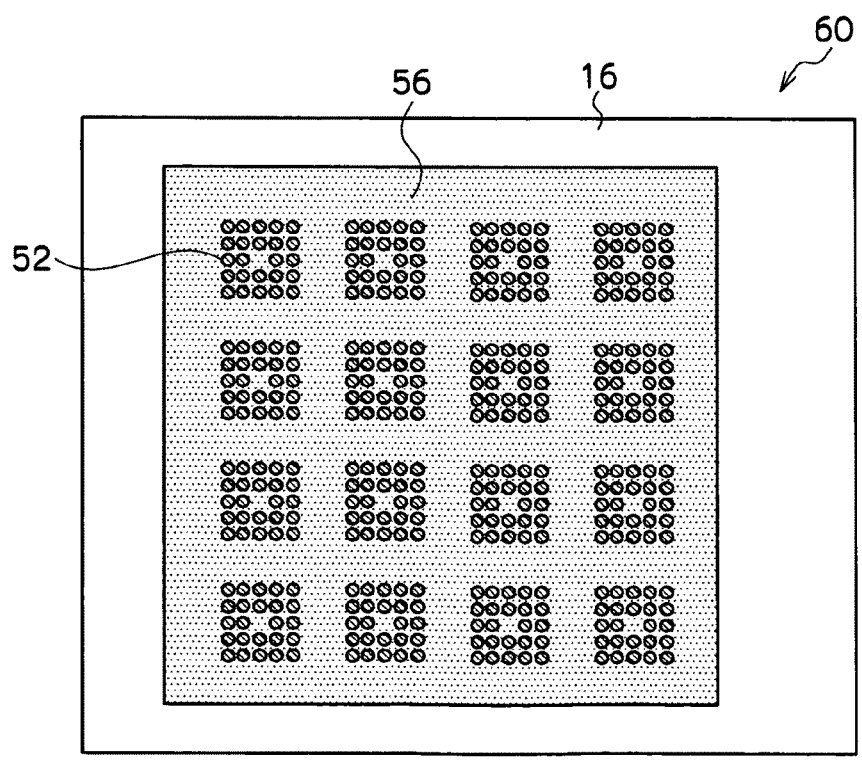

FIG. 9A and FIG. 9B are diagrams showing the process of forming the resist film. FIG. 9A is a partial cross-sectional diagram of the frame substrate 60, and FIG. 9B is a plan diagram of the frame substrate 60 as seen from a surface side.

The solder resist 56 is applied in a predetermined pattern, such that just the rewiring pads 52 are exposed, to the grinded surface 50G on which the rewiring pattern has been formed. The grinded surface 50G and also the wires 54 that have been formed on the grinded surface 50G are covered by the solder resist 56. By covering the package substrates 12 with the solder resist 56, warpage of the package substrates 12 can be prevented.

(Dicing Process)

Finally, the frame substrate 60 is diced to fragment the individual packages.

Figure 10A:
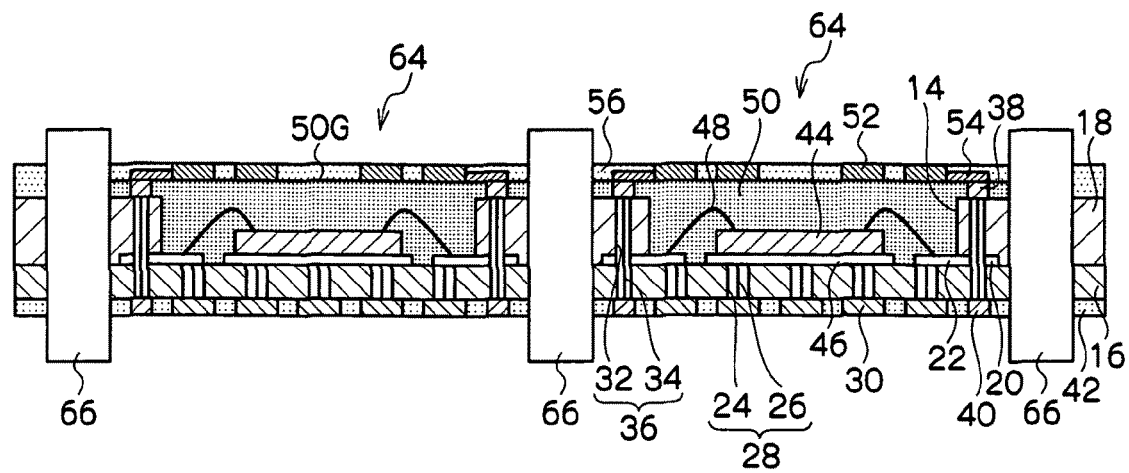
FIG. 10A and FIG. 10B are diagrams showing a dicing process, with FIG. 10A being a partial cross-sectional diagram and FIG. 10B being a plan diagram as seen from a surface side.
Figure 10B:
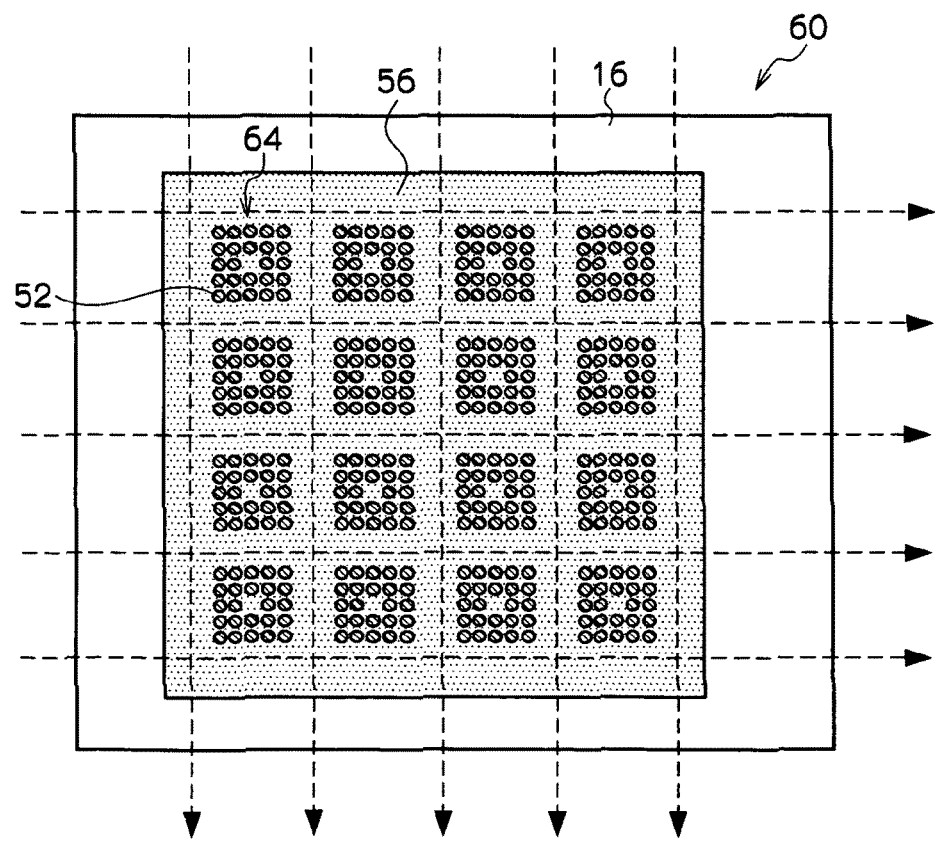

FIG. 10A and FIG. 10B are diagrams showing the dicing process. FIG. 10A is a partial cross-sectional diagram of the frame substrate 60, and FIG. 10B is a plan diagram of the frame substrate 60 as seen from a surface side.

Plural package structures 64 are formed on the frame substrate 60. In the present embodiment, as shown in FIG. 10B, there are sixteen of the double-sided electrode package structures 64 arranged in a 4×4 matrix on the illustrated portion of the frame substrate 60. Unillustrated blades are moved in the directions of the arrows to saw-cut the frame substrate 60 in a grid-like manner and fragment the individual double-sided electrode package structures 64. Thus, the double-sided electrode packages 10 are completed. Further, blade passage regions 66 of the frame substrate 60 are removed by saw-cutting. As the blades, diamond blades or the like can be used.

As described above, according to the present embodiment, the sealing resin that mold-seals the semiconductor chips is grinded from the surface side, whereby thinning of the double-sided electrode packages can be realized extremely easily.

Further, because the rewiring pads can be arranged (re-wired) in an arbitrary layout, connection to a package laminated on top becomes easy. Further, because the surfaces of the lands and the grinded surface are formed in the same height (same surface), formation of the rewiring pattern is easy.

Further, because the grinded surface is a rough surface, the grinded surface has excellent adhesion to the rewiring pattern. For this reason, it is difficult for wire breakage resulting from stripping of the rewiring pattern to occur.

Figure 11:
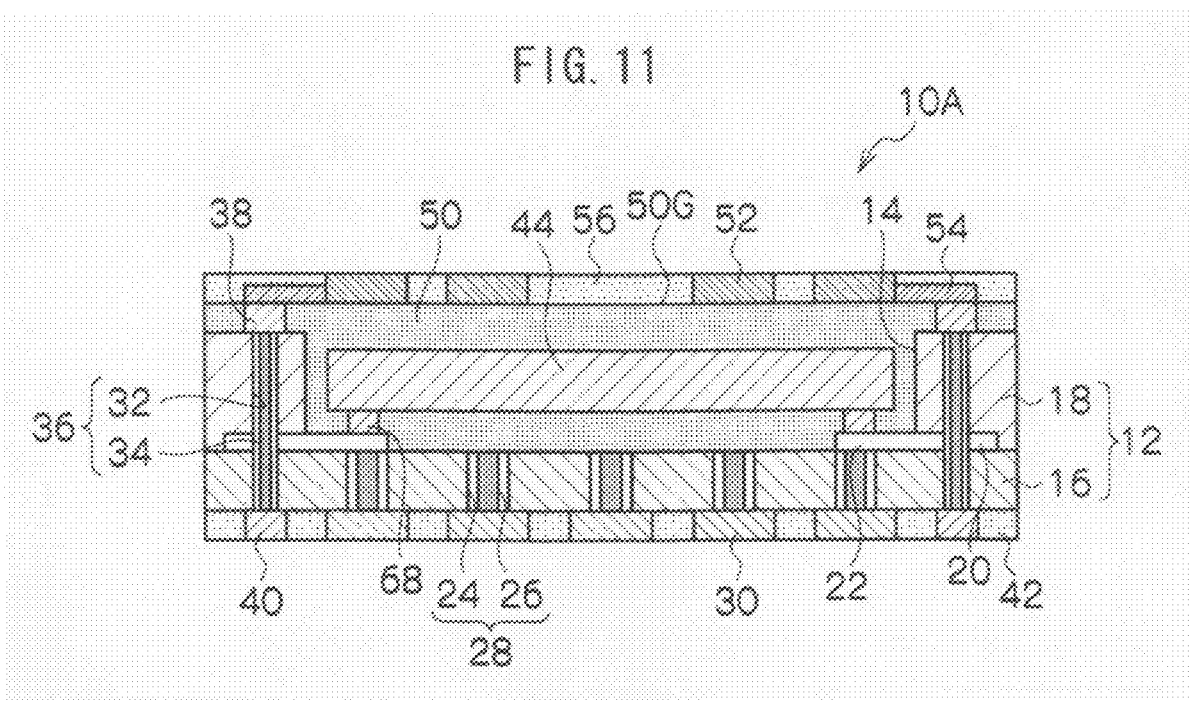
FIG. 11 is a cross-sectional diagram showing a modification of the first embodiment in which a semiconductor chip is flip-chip connected.

It will be noted that, in the above-described first embodiment, the semiconductor chip 44 is wire-bond connected, but the semiconductor chip 44 may also be flip-chip connected via bumps. FIG. 11 is a cross-sectional diagram showing a modification of the first embodiment in which the semiconductor chip 44 is flip-chip connected. The configuration is the same as that of the first embodiment except that the semiconductor chip 44 is flip-chip connected, so the same reference numerals will be given to the same configural portions and description of those same configural portions will be omitted.

In a double-sided electrode package 10A pertaining to the modification of the first embodiment, the semiconductor chip 44 is housed face-down in the cavity 14 of the package substrate 12. The electrodes (not shown) formed on the surface of the semiconductor chip 44 are directly connected to the bonding pads 22 by bumps 68 of metal such as solder, and the semiconductor chip 44 is flip-chip connected to the package substrate 12. Further, the bumps 68 and the bonding pads 22 are, similar to the semiconductor chip 44 inside the cavity 14, also sealed by the sealing resin 50. Flip-chip connections have high reliability. Further, according to flip-chip connections, it is not necessary to consider the loop height of metal wires and double-sided electrode packages can be thinned even more.

Further, in the above-described first embodiment, an example has been described where the lands 38 that are terminal-use wires are formed on the surface of the package substrate 12, the molded sealing resin 50M is grinded until the lands 38 are exposed, and the grinded surface 50G is given the same height (same surface) as the surfaces of the lands 38, but the package can also be configured such that the lands 38 are not disposed, the sealing resin 50M is grinded until the end portions of the penetrating electrodes 36 are exposed, and the grinded surface 50G is given the same height (same surface) as the surface of the package substrate 12 (the surface of the insulating layer 18).

Further, in the above-described first embodiment, an example has been described where the surface of the double-sided electrode package 10 is covered by the solder resist 56, but the solder resist 56 can be omitted.

Second Embodiment

In the above-described first embodiment, a semiconductor chip is wire-bond connected to a package substrate and the top of the semiconductor chip is covered by a sealing resin. In contrast, in a second embodiment, a semiconductor chip is flip-chip connected to a package substrate, an insulating film is formed on the back surface of the semiconductor chip, and this insulating film is exposed to a grinded surface. The remaining configuration, such as the configuration of the package substrate, is substantially the same as that of the first embodiment, so the same reference numerals will be given to the same configural portions and description of those same configural portions will be omitted.

(Double-Sided Electrode Package)

Figure 12A:
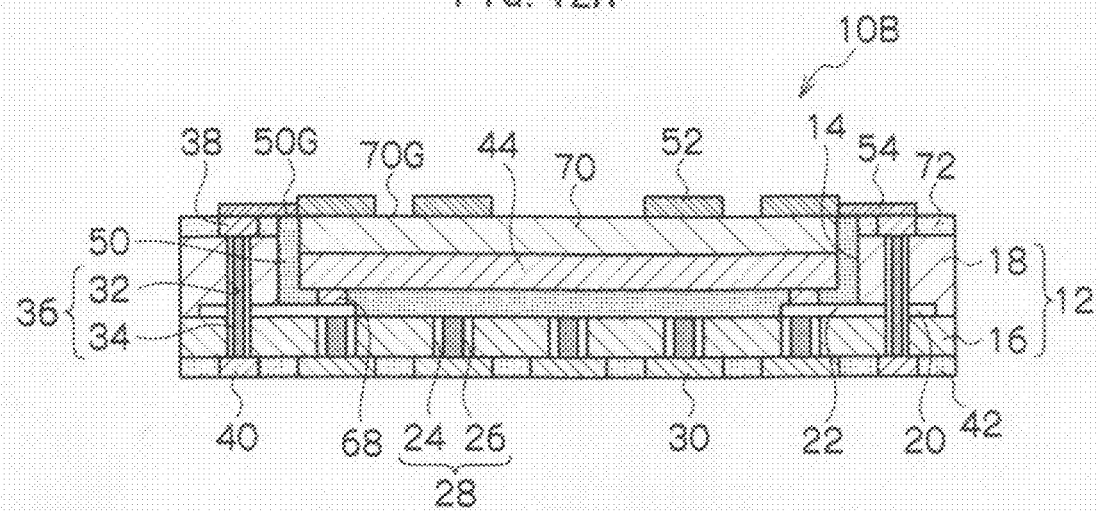
FIG. 12A is a general cross-sectional diagram showing the configuration of a double-sided electrode package pertaining to a second embodiment of the present invention.
Figure 12B:
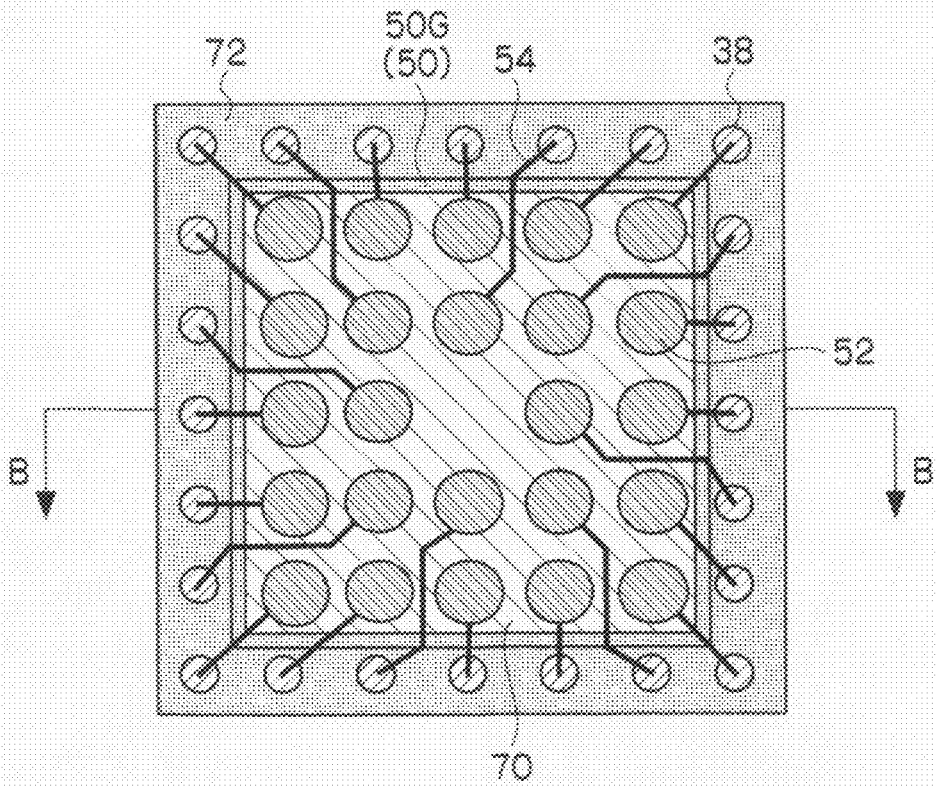
FIG. 12B is a plan diagram of the same double-sided electrode package as seen from a surface side.

FIG. 12A is a general cross-sectional diagram showing the configuration of a double-sided electrode package 10B pertaining to the second embodiment of the present invention. FIG. 12B is a plan diagram of the same double-sided electrode package 10B as seen from a surface side. FIG. 12A is a cross-sectional diagram along B-B of FIG. 12B.

The double-sided electrode package 10B pertaining to the second embodiment is disposed with a package substrate 12 that has substantially the same structure as that of the package substrate 12 of the first embodiment. As mentioned above, the package substrate 12 is disposed with the cavity 14, the core material 16, the insulating layer 18, the wires 20, the bonding pads 22, the penetrating electrodes 28, the electrode pads 30, the penetrating electrodes 36, the lands 38, the lands 40 and the solder resist 42. Further, in contrast to the first embodiment, as shown in FIG. 12A and FIG. 12B, the surface of the package substrate 12 (the surface of the insulating layer 18) is, excluding the lands 38, covered by a solder resist 72.

A heat dissipating insulating film 70 is formed on the back surface of the semiconductor chip 44. The heat dissipating insulating film 70 can be configured by an insulating material such as a polyimide, for example. The heat dissipating insulating film 70 can be formed by applying an insulating tape of a polyimide or the like to the back surface of the semiconductor chip 44. The semiconductor chip 44, on whose back surface the insulating film 70 has been formed, is housed face-down in the cavity 14 of the package substrate 12. The electrodes (not shown) formed on the surface of the semiconductor chip 44 are directly connected to the bonding pads 22 by bumps 68 of metal such as solder, and the semiconductor chip 44 is flip-chip connected to the package substrate 12. Flip-chip connections have high reliability.

The inside of the cavity 14 is filled with a sealing resin 50 so as to fill a gap between the package substrate 12 and the semiconductor chip 44. The semiconductor chip 44 inside the cavity 14 is sealed by the sealing resin 50. Similarly, the bumps 68 and the bonding pads 22 are also sealed by the sealing resin 50. The surface of the sealing resin 50 is, as described later, given the same height (same surface) as the surfaces of the lands 38 by grinding, from the surface, a resin layer that has been molded so as to cover the semiconductor chip 44. The surface of the sealing resin 50 is a grinded surface 50G formed by grinding.

As a result, the lands 38 and the insulating film 70 are exposed to the surface of the double-sided electrode package 10B. At the same time, the sealing resin 50 is exposed over the cavity 14 where the insulating film 70 is not present, and the solder resist 72 is exposed over the insulating layer 18. Because the lands 38 and the insulating film 70 are exposed to the surface, the double-sided electrode package 10B can be made into one having excellent heat dissipating ability.

Plural rewiring pads 52 are formed on the surface of the double-sided electrode package 10B. In the present embodiment, as shown in FIG. 12B, there are twenty-four of the rewiring pads 52 arranged in a 5×5 matrix excluding one in the center. It will be noted that the number of the rewiring pads 52 can be appropriately changed in accordance with the number of the lands 38 and the like.

Further, as mentioned above, in the present embodiment, as shown in FIG. 12B, there are twenty-four of the lands 38 formed on the surface of the package substrate 12. Wires 54 that interconnect these lands 38 and the rewiring pads 52 in a one-to-one ratio are formed on the surface of the double-sided electrode package 10B, and rewiring is performed on the surface of the double-sided electrode package 10B.

(Method of Fabricating Double-Sided Electrode Package)

Next, a method of fabricating the double-sided electrode package 10B will be described. FIG. 13 to FIG. 18 are diagrams showing processes of fabricating the double-sided electrode package 10B pertaining to the second embodiment. As mentioned above, in the processes of fabricating the double-sided electrode package 10B, a plurality of double-sided electrode package structures are formed on the frame substrate 60, and the frame substrate 60 is finally divided into individual double-sided electrode packages 10B. Below, the processes of fabricating the double-sided electrode packages 10B will be described in order.

(Process of Preparing Frame Substrate)

Figure 13:
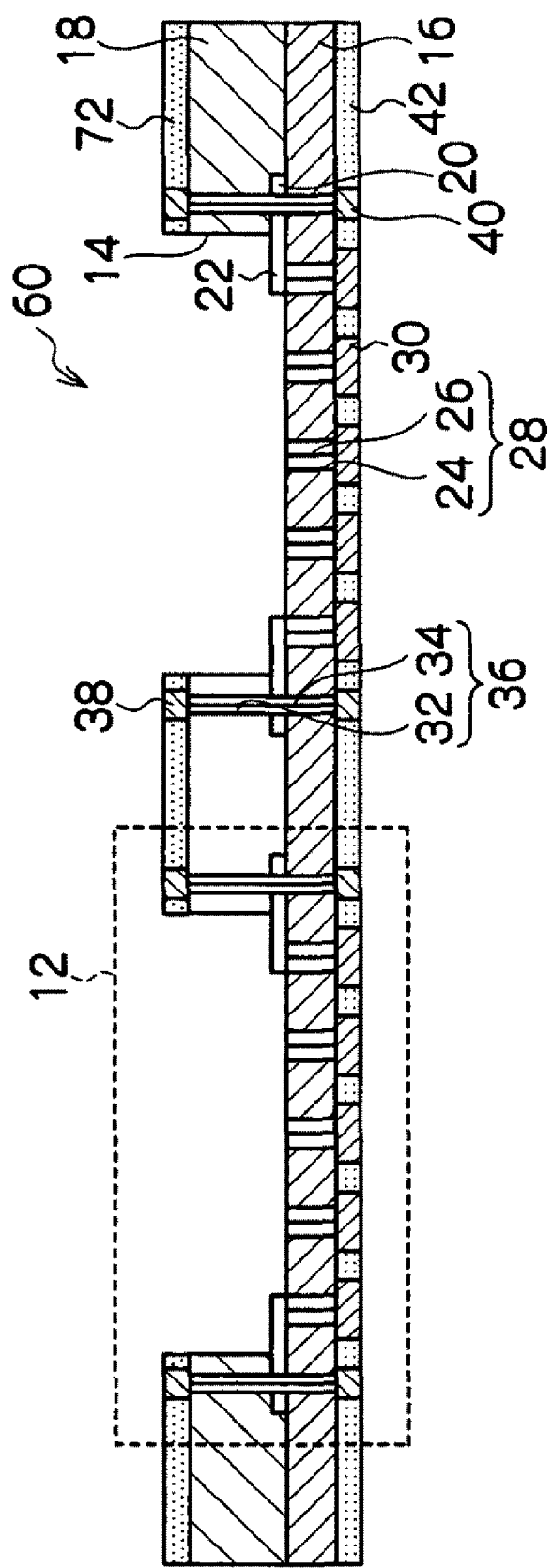
FIG. 13 is a partial cross-sectional diagram showing a process of preparing a frame substrate.

First, a single frame substrate 60, on which a plurality of the package substrates 12 have been formed, is prepared. FIG. 13 is a partial cross-sectional diagram showing the process of preparing the frame substrate 60. A plurality of the package substrates 12 are formed on the frame substrate 60. Here, FIG. 13 illustrates just a portion including two of the package substrates 12. The portion enclosed by the dotted line corresponds to one package substrate 12.

The frame substrate 60 can be made in the same manner as in the first embodiment with the exception that the surface of the insulating layer 18 is, excluding the lands 38, covered by the solder resist 72, so description will be omitted here.

(Process of Arranging Semiconductor Chips)

Figure 14:
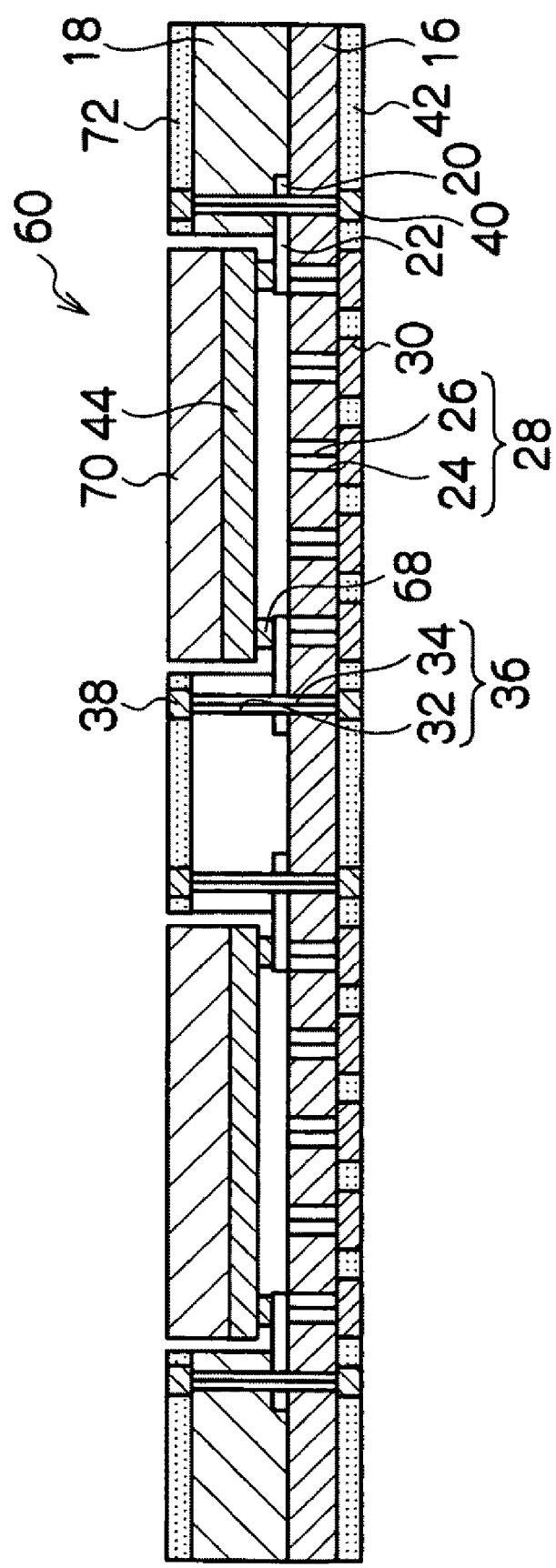
FIG. 14 is a partial cross-sectional diagram showing a process of arranging semiconductor chips.

Next, the semiconductor chips 44 are housed in the cavities 14 of the individual package substrates 12. FIG. 14 is a partial cross-sectional diagram showing the process of arranging the semiconductor chips 44. Although they are not illustrated, plural electrodes are disposed on the surface of each of the semiconductor chips 44. The bumps 68 of metal such as solder are formed on these plural electrodes. Further, a heat dissipating insulating tape is adhered to the back surface of each of the semiconductor chips 44 to form the insulating films 70.

The semiconductor chips 44, on whose back surfaces the insulating films 70 have been formed, are housed face-down in the cavities 14. At this time, the semiconductor chips 44 on which the insulating films 70 have been formed are arranged such that the surfaces of the insulating films 70 (the surfaces on the opposite sides of the adhesive surfaces) become the same height (same surface) as the surfaces of the lands 38. The electrodes (not shown) formed on the surfaces of the semiconductor chips 44 are directly connected to the bonding pads 22 by the bumps 68. Thus, the semiconductor chips 44 are flip-chip connected to the package substrates 12. Similarly, the semiconductor chips 44 are fixed in the cavities 14 of the frame substrate 60.

(Process of Sealing Semiconductor Chips)

Figure 15:
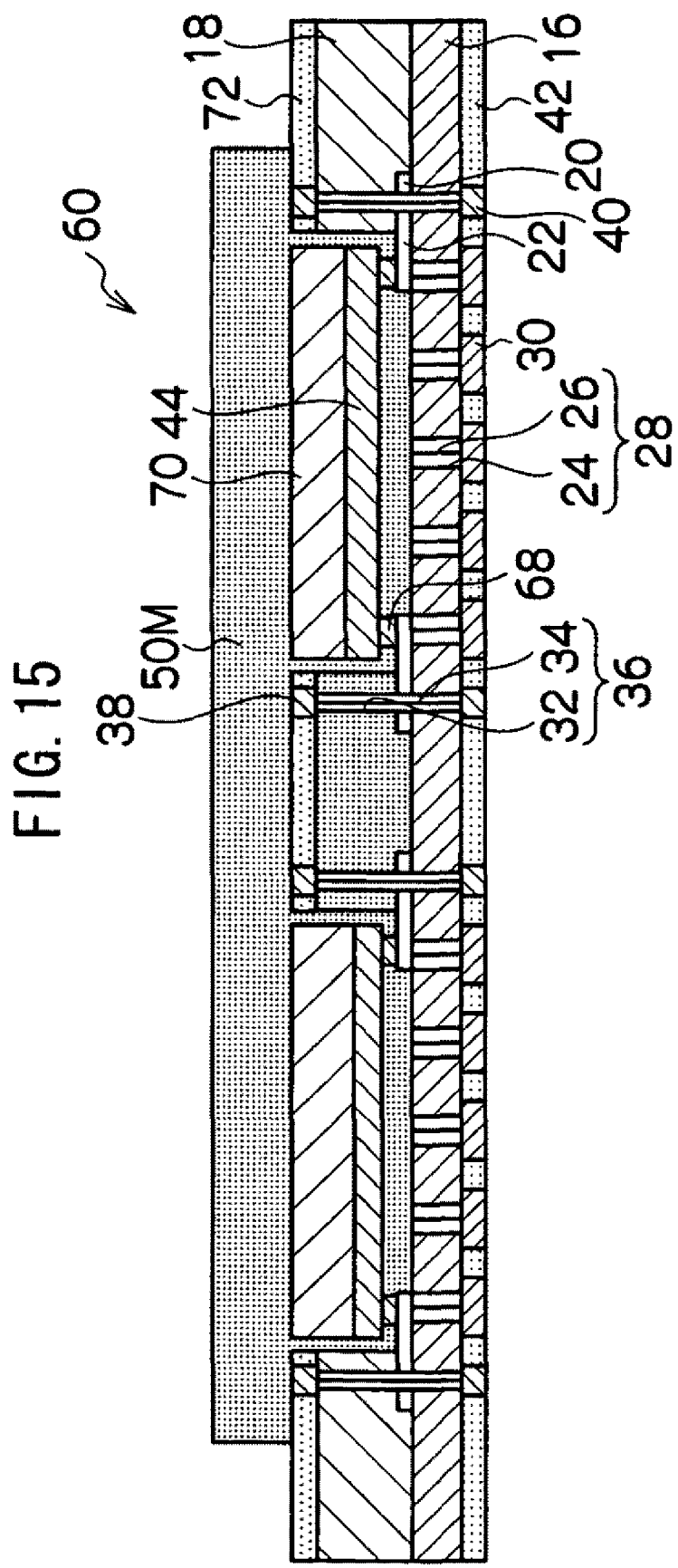
FIG. 15 is a partial cross-sectional diagram showing a process of sealing the semiconductor chips.

Next, the semiconductor chips 44 are sealed by a sealing resin. FIG. 15 is a partial cross-sectional diagram showing the process of sealing the semiconductor chips 44. The sealing by the sealing resin is, similarly to the first embodiment, performed by transfer. A range that is wider than a region where the plural package substrates 12 are formed is covered by the sealing resin 50M. Further, the frame substrate 60 is covered by the sealing resin 50M such that the lands 38 and the insulating films 70 formed on the back surfaces of the semiconductor chips 44 are covered. The surface of the frame substrate 60 is covered by the sealing resin 50M, whereby the bonding pads 22 and the bumps 68 are also simultaneously sealed together with the semiconductor chips 44. Further, a range that is wider than the region where the plural package substrates 12 are formed is covered by the sealing resin 50M, whereby the semiconductor chips 44 housed in the individual cavities 14 are collectively sealed.

(Process of Grinding Sealing Resin)

Figure 16:
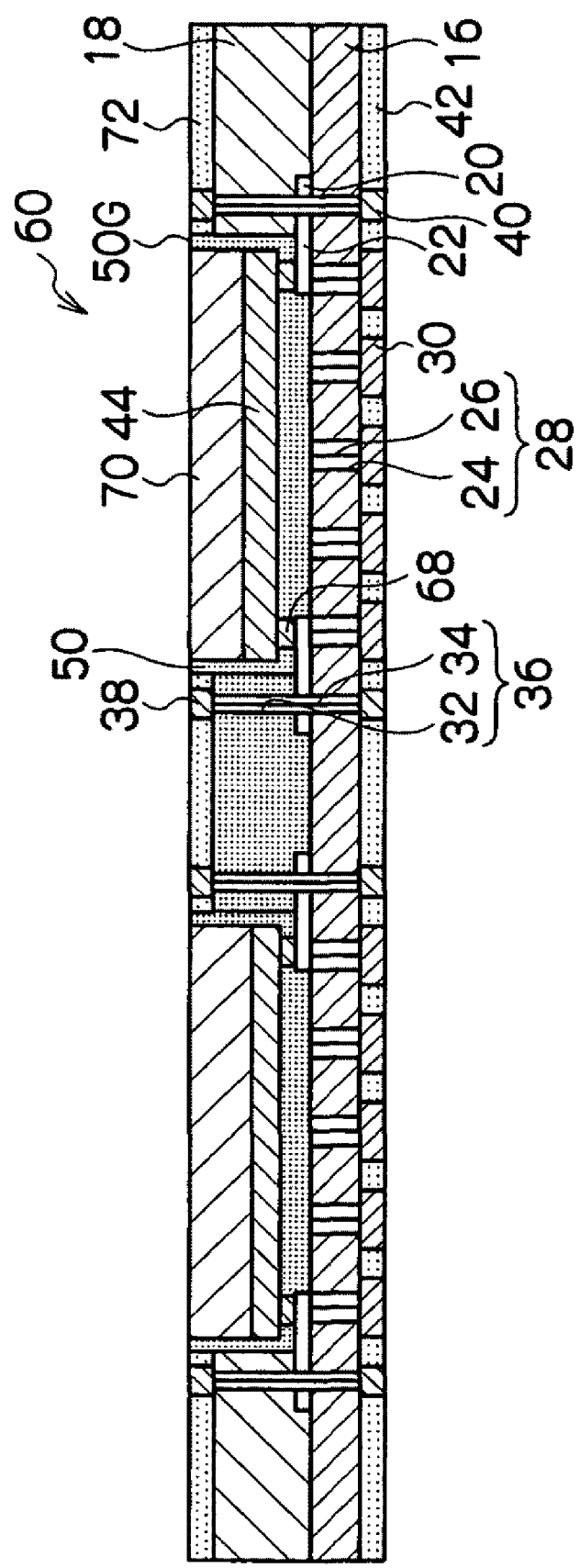
FIG. 16 is a partial cross-sectional diagram showing a process of grinding a sealing resin.

Next, the sealing resin 50M is grinded from the surface side. FIG. 16 is a partial cross-sectional diagram showing the process of grinding the sealing resin 50M. After the surface of the frame substrate 60 has been covered by the sealing resin 50M, a grinding device such as a grinder is used to grind the sealing resin 50M from the surface side until the lands 38 and the insulating films 70 are exposed. A grinded surface 50G with the same height (same surface) as the surfaces of the lands 38 is formed on the surface of the sealing resin 50. The grinded surface 50G becomes parallel to the surfaces of the package substrates 12 (the surfaces of the insulating layers 18). As shown in FIG. 16, the lands 38, the grinded surface 50G, the insulating films 70 and the solder resist 72 are exposed to the surface of the frame substrate 60.

As mentioned above, in the present invention, the molded sealing resin 50M is grinded from the surface side, whereby a thin sealing resin layer can be formed and thinning of the double-sided electrode packages can be realized extremely easily. Further, because the insulating films 70 are exposed together with the lands 38 to the surface of the frame substrate 60, the heat dissipating ability becomes higher and resins whose rates of thermal expansion and rates of thermal contraction are different can be prevented from stripping during reflow. For example, the sealing resin 50 and the solder resist 72 can be prevented from stripping.

(Rewiring Process)

Figure 17:
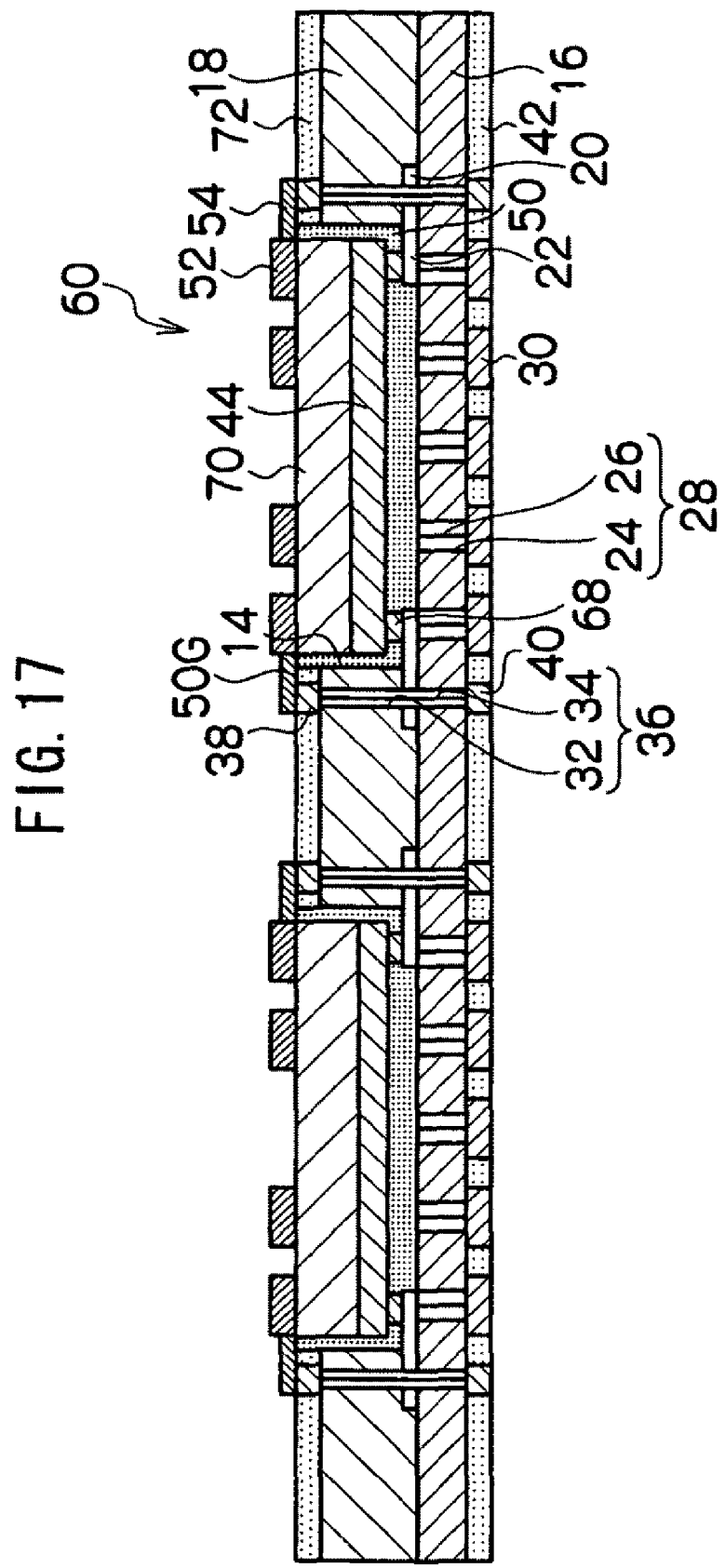
FIG. 17 is a partial cross-sectional diagram showing a rewiring process.

Next, rewiring is performed on the insulating films 70. FIG. 17 is a partial cross-sectional diagram showing the rewiring process. The rewiring pads 52 and the wires 54 are formed in a predetermined pattern by metal nanoparticles on the insulating films 70 exposed to the surface of the frame substrate 60. Because the surfaces of the lands 38, the grinded surface 50G, the surfaces of the insulating films 70 and the surface of the solder resist 72 are formed in the same height (same surface), formation of the rewiring pattern is easy. The rewiring pads 52 can be arranged (rewired) in an arbitrary layout such that connection to a package laminated on top becomes easy. The wires 54 are formed so as to interconnect the lands 38 and the rewiring pads 52 in a one-to-one ratio.

(Dicing Process)

Finally, the frame substrate 60 is diced to fragment the individual packages. FIG. 18 is a partial cross-sectional diagram showing the dicing process. Plural package structures 64 are formed on the frame substrate 60. Unillustrated blades are moved to saw-cut the frame substrate 60 in a grid-like manner and fragment the individual double-sided electrode package structures 64. Thus, the double-sided electrode packages 10B are completed. Further, blade passage regions 66 of the frame substrate 60 are removed by saw-cutting.

As described above, according to the present embodiment, the sealing resin that mold-seals the semiconductor chips is grinded from the surface side, whereby thinning of the double-sided electrode packages can be realized extremely easily. Further, because the semiconductor chips are flip-chip connected, the double-sided electrode packages can be thinned even more.

Further, because the rewiring pads can be arranged (rewired) in an arbitrary layout, connection to a package laminated on top becomes easy. Further, because the surfaces of the lands, the grinded surface, the surfaces of the insulating films and the surface of the solder resist are formed in the same height (same surface), formation of the rewiring pattern is easy.

Further, because the surfaces of the insulating films of the semiconductor chips are exposed, the heat dissipating ability is high, and stripping of resin resulting from heat such as during reflow (soldering) when the substrates are packaged can be prevented.

It will be noted that, in the above-described second embodiment, an example has been described where the rewiring pads 52 are formed on the insulating films 70, but because the surfaces of the lands 38, the grinded surface 50G, the surfaces of the insulating films 70 and the surface of the solder resist 72 are formed in the same height (same surface), the rewiring pads 52 can be arranged (rewired) in an arbitrary layout on the same surface. For example, the rewiring pads 52 can also be formed on the grinded surface 50G or the surface of the solder resist 72.

Further, in the above-described second embodiment, the solder resist on the surface of the double-sided electrode package 10B is omitted, but the surface of the double-sided electrode package 10B may also be covered by a solder resist.

Third Embodiment

In the above-described first embodiment, a semiconductor chip is wire-bond connected to a package substrate, and a sealing resin is grinded as far as the land surfaces to expose the lands from the grinded surface. In contrast, in a third embodiment, a semiconductor chip is flip-chip connected to a package substrate, a sealing resin is grinded as far as the tops of the land surfaces, and thereafter through holes are formed to expose the lands. The remaining configuration, such as the configuration of the package substrate, is substantially the same as that of the first embodiment, so the same reference numerals will be given to the same configural portions and description of those same configural portions will be omitted.

(Double-Sided Electrode Package)

Figure 19A:
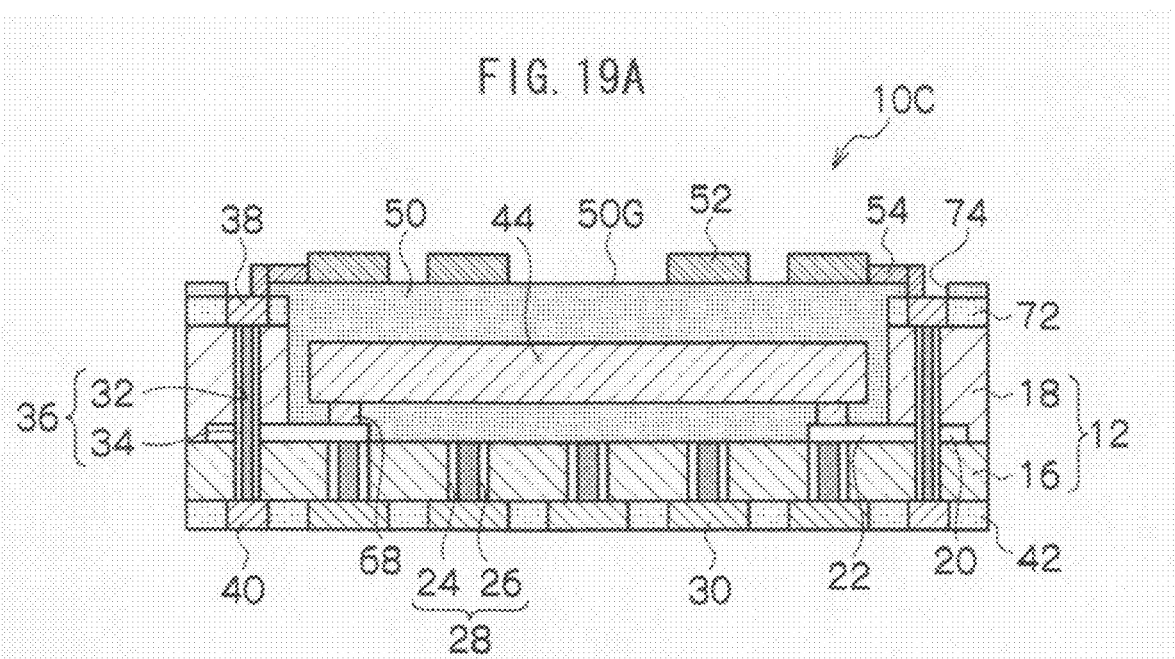
FIG. 19A is a general cross-sectional diagram showing the configuration of a double-sided electrode package pertaining to a third embodiment of the present invention.
Figure 19B:
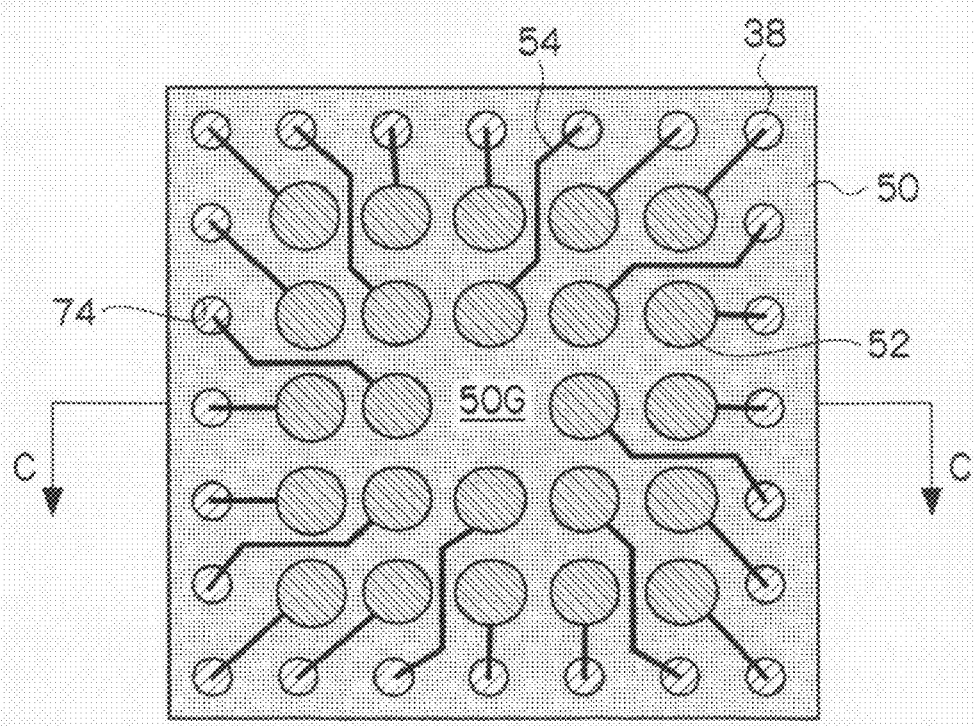
FIG. 19B is a plan diagram of the same double-sided electrode package as seen from a surface side.

FIG. 19A is a general cross-sectional diagram showing the configuration of a double-sided electrode package 10C pertaining to the third embodiment of the present invention. FIG. 19B is a plan diagram of the same double-sided electrode package 10C as seen from a surface side. FIG. 19A is a cross-sectional diagram along C-C of FIG. 19B.

The double-sided electrode package 10C pertaining to the third embodiment is disposed with a package substrate 12 that has substantially the same structure as that of the package substrate 12 of the first embodiment. As mentioned above, the package substrate 12 is disposed with the cavity 14, the core material 16, the insulating layer 18, the wires 20, the bonding pads 22, the penetrating electrodes 28, the electrode pads 30, the penetrating electrodes 36, the lands 38, the lands 40 and the solder resist 42. Further, in contrast to the first embodiment, as shown in FIG. 19A, the surface of the package substrate 12 (the surface of the insulating layer 18) is, excluding the lands 38, covered by the solder resist 72.

The semiconductor chip 44 is housed face-down in the cavity 14 of the package substrate 12. The electrodes (not shown) formed on the surface of the semiconductor chip 44 are directly connected to the bonding pads 22 by bumps 68 of metal such as solder, and the semiconductor chip 44 is flip-chip connected to the package substrate 12. Further, the bumps 68 and the bonding pads 22 are also, similarly to the semiconductor chip 44 inside the cavity 14, sealed by a sealing resin 50. Flip-chip connections have high reliability. Further, according to flip-chip connections, it is not necessary to consider the loop height of metal wires and double-sided electrode packages can be thinned even more.

The inside of the cavity 14 is filled with the sealing resin 50 so as to fill a gap between the package substrate 12 and the semiconductor chip 44. The semiconductor chip 44 inside the cavity 14 is sealed by the sealing resin 50. Similarly, the bonding pads 22 and the bumps 68 are also sealed by the sealing resin 50. The surface of the sealing resin 50 is, as described later, made higher than the surfaces of the lands 38 by grinding, from the surface, a resin layer that has been molded so as to cover the semiconductor chip 44. The surface of the sealing resin 50 is a grinded surface 50G formed by grinding.

As a result, the surface of the double-sided electrode package 10C, including the solder resist 72, is covered by the sealing resin 50. The surface of the double-sided electrode package 10C is covered by one type of resin, whereby stripping of resin resulting from heat such as during reflow (soldering) when the substrates are packaged can be prevented.

Recessed portions 74 are formed in the surface of the package substrate 12 so as to penetrate the sealing resin 50 and expose the lands 38.

Plural rewiring pads 52 are formed on the surface of the double-sided electrode package 10C. In the present embodiment, as shown in FIG. 19B, there are twenty-four of the rewiring pads 52 arranged in a 5×5 matrix excluding one in the center. It will be noted that the number of the rewiring pads 52 can be appropriately changed in accordance with the number of the lands 38 and the like.

Further, as mentioned above, in the present embodiment, as shown in FIG. 19B, there are twenty-four of the lands 38 formed on the surface of the package substrate 12. Wires 54 that interconnect these lands 38 and the rewiring pads 52 in a one-to-one ratio are formed on the surface of the double-sided electrode package 10C, and rewiring is performed on the surface of the double-sided electrode package 10C.

(Method of Fabricating Double-Sided Electrode Package)

Next, a method of fabricating the double-sided electrode package 10C will be described. FIG. 20 to FIG. 27 are diagrams showing processes of fabricating the double-sided electrode package 10C pertaining to the third embodiment. As mentioned above, in the processes of fabricating the double-sided electrode package 10C, a plurality of double-sided electrode package structures are formed on the frame substrate 60, and the frame substrate 60 is finally divided into individual double-sided electrode packages 10C. Below, the processes of fabricating the double-sided electrode packages 10C will be described in order.

(Process of Preparing Frame Substrate)

Figure 20:
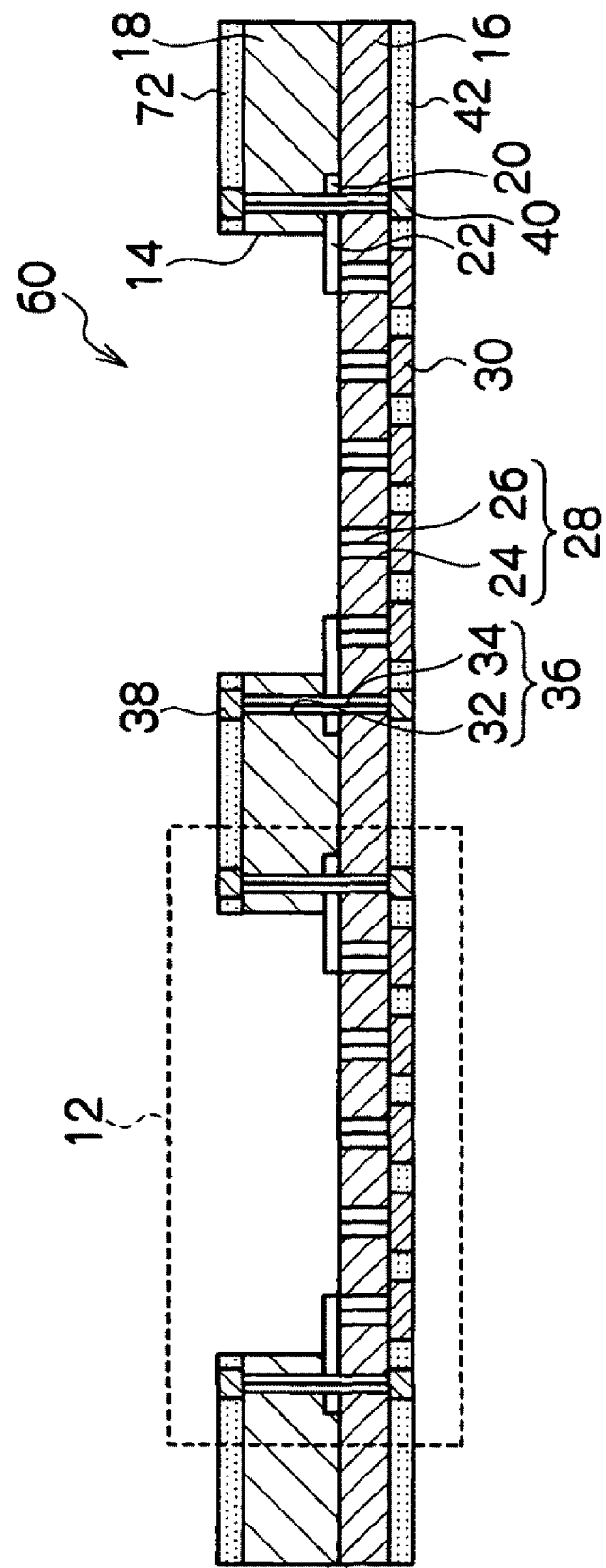
FIG. 20 is a partial cross-sectional diagram showing a process of preparing a frame substrate.

First, a single frame substrate 60, on which a plurality of the package substrates 12 have been formed, is prepared. FIG. 20 is a partial cross-sectional diagram showing the process of preparing the frame substrate 60. A plurality of the package substrates 12 are formed on the frame substrate 60. Here, FIG. 20 illustrates just a portion including two of the package substrates 12. The portion enclosed by the dotted line corresponds to one package substrate 12. The frame substrate 60 can be made in the same manner as in the first embodiment with the exception that the surface of the insulating layer 18 is covered by the solder resist 72 so as to leave the lands 38, so description will be omitted here.

(Process of Arranging Semiconductor Chips)

Figure 21:
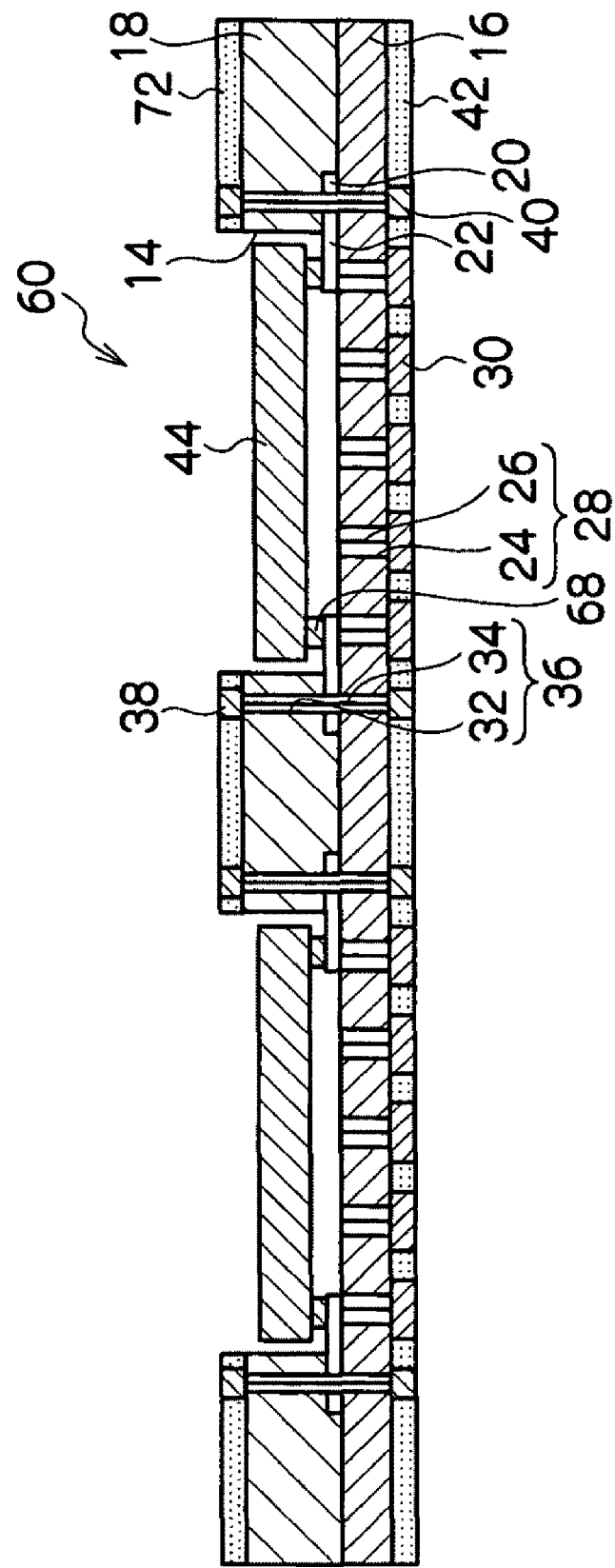
FIG. 21 is a partial cross-sectional diagram showing a process of arranging semiconductor chips.

Next, the semiconductor chips 44 are housed in the cavities 14 of the individual package substrates 12. FIG. 21 is a partial cross-sectional diagram showing the process of arranging the semiconductor chips 44. Although they are not illustrated, plural electrodes are disposed on the surface of each of the semiconductor chips 44. The bumps 68 of metal such as solder are formed on these plural electrodes. The semiconductor chips 44 are housed face-down in the cavities 14. The electrodes (not shown) formed on the surfaces of the semiconductor chips 44 are directly connected to the bonding pads 22 by the bumps 68. Thus, the semiconductor chips 44 are flip-chip connected to the package substrates 12. Similarly, the semiconductor chips 44 are fixed in the cavities 14 of the frame substrate 60.

(Process of Sealing Semiconductor Chips)

Figure 22:
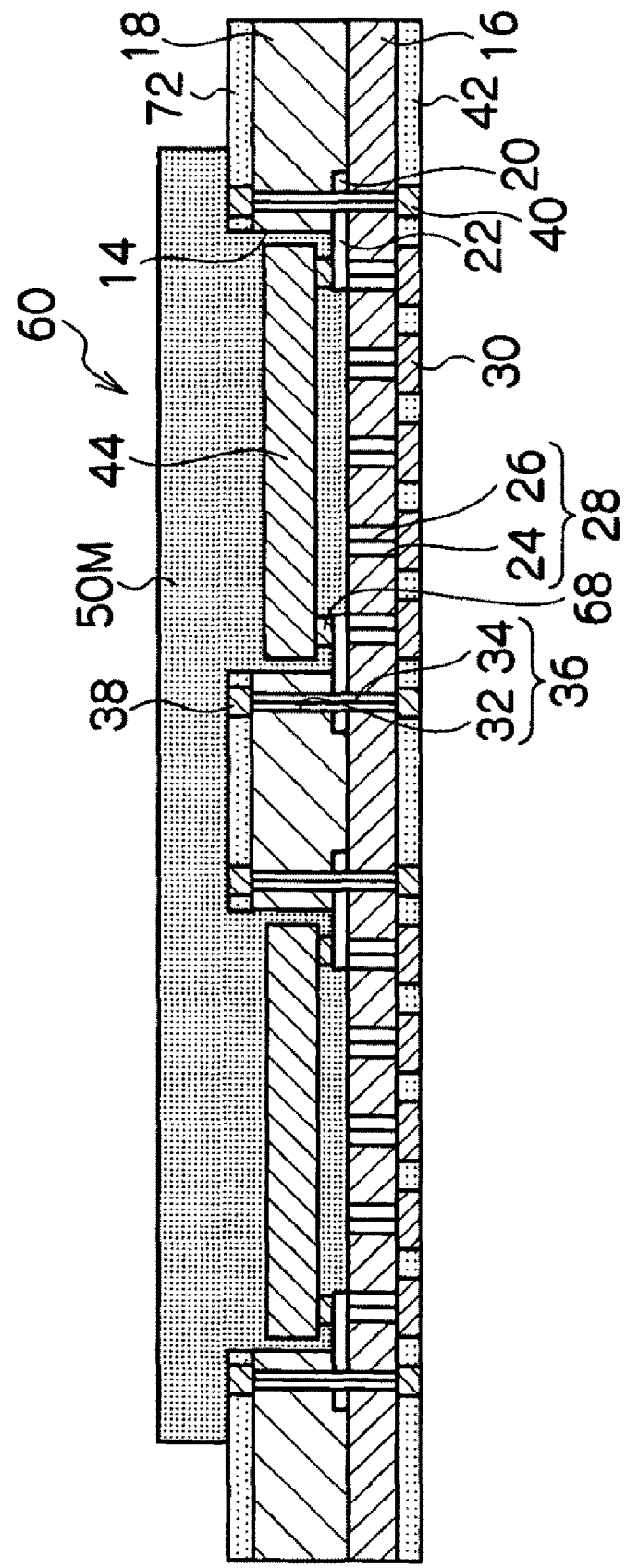
FIG. 22 is a partial cross-sectional diagram showing a process of sealing the semiconductor chips.

Next, the semiconductor chips 44 are sealed by a sealing resin. FIG. 22 is a partial cross-sectional diagram showing the process of sealing the semiconductor chips 44. The sealing by the sealing resin is, similarly to the first embodiment, performed by transfer. A range that is wider than a region where the plural package substrates 12 are formed is covered by the sealing resin 50M. Further, the frame substrate 60 is covered by the sealing resin 50M such that the lands 38 are covered. The surface of the frame substrate 60 is covered by the sealing resin 50M, whereby the bonding pads 22 and the bumps 68 are also simultaneously sealed together with the semiconductor chips 44. Further, a range that is wider than the region where the plural package substrates 12 are formed is covered by the sealing resin 50M, whereby the semiconductor chips 44 housed in the individual cavities 14 are collectively sealed.

(Process of Grinding Sealing Resin)

Figure 23:
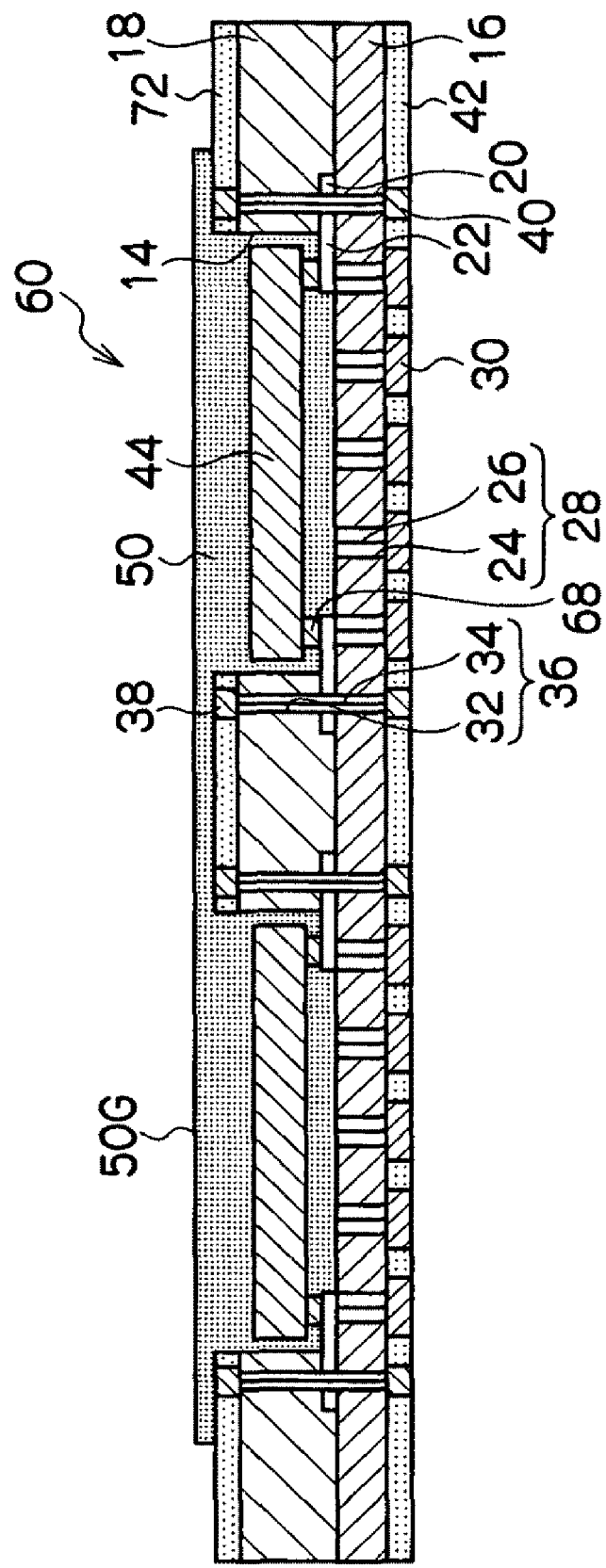
FIG. 23 is a partial cross-sectional diagram showing a process of grinding a sealing resin.

Next, the sealing resin 50M is grinded from the surface side. FIG. 23 is a partial cross-sectional diagram showing the process of grinding the sealing resin 50M. After the surface of the frame substrate 60 has been covered by the sealing resin 50M, a grinding device such as a grinder is used to grind the sealing resin 50M from the surface side such that the lands 38 are not exposed. For example, the sealing resin 50M is grinded to a thickness of about 10 to 50 µm from the surfaces of the lands 38. A grinded surface 50G with substantially the same height as the surfaces of the lands 38 is formed on the surface of the sealing resin 50. The grinded surface 50G becomes parallel to the surfaces of the package substrates 12 (the surfaces of the insulating layers 18). As shown in FIG. 23, the surface of the frame substrate 60 is covered by the sealing resin 50.

As mentioned above, in the present invention, the molded sealing resin 50M is grinded from the surface side, whereby a thin sealing resin layer can be formed and thinning of the double-sided electrode packages can be realized extremely easily. Further, because the surface of the frame substrate 60 is uniformly covered by the sealing resin 50, stripping of resin resulting from heat such as during reflow (soldering) when the substrates are packaged can be prevented.

(Hole Punching Process)

Figure 24:
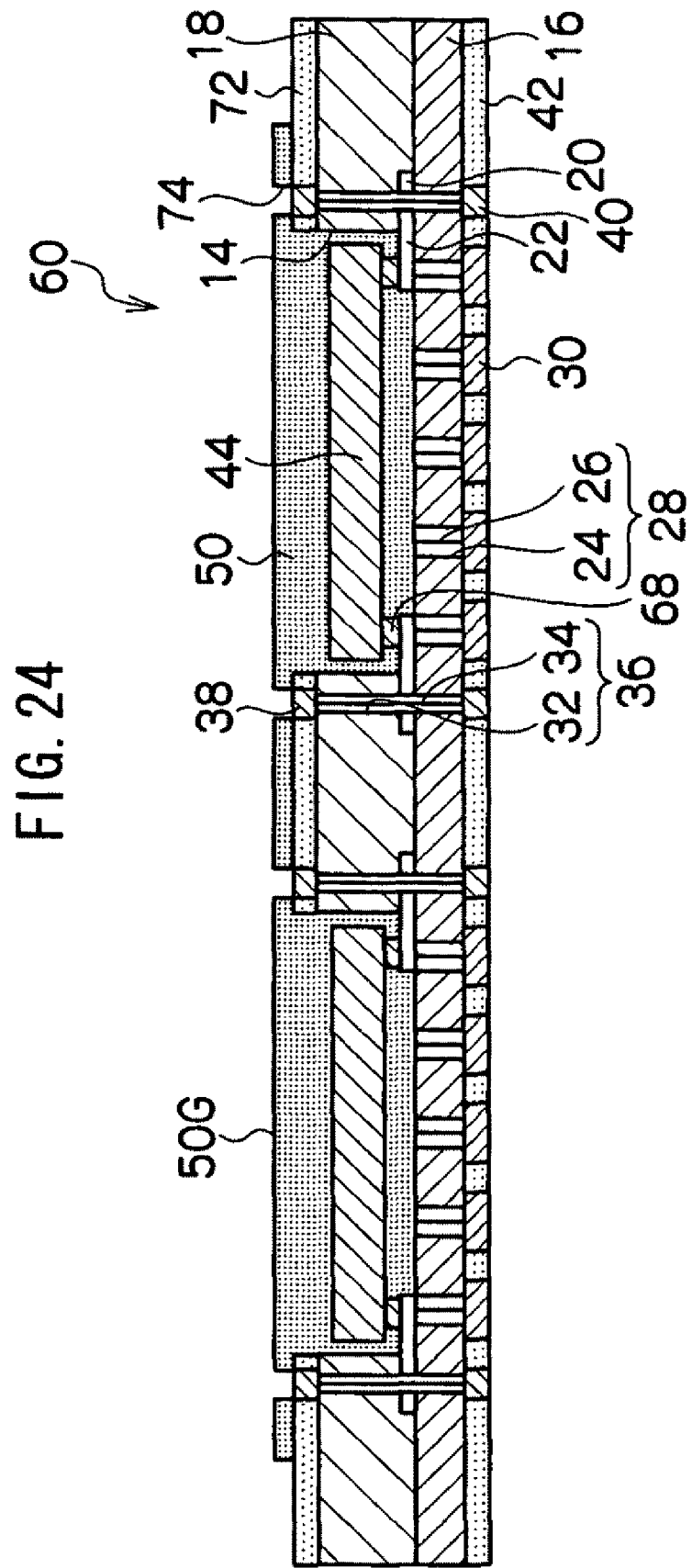
FIG. 24 is a partial cross-sectional diagram showing a hole punching process.

Next, through holes that penetrate the sealing resin 50 are formed. FIG. 24 is a partial cross-sectional diagram showing the hole punching process. The sealing resin 50 over the lands 38 is removed by irradiation with laser light to thereby form the recessed portions 74 in the sealing resin 50 on which the grinded surface 50G has been formed. The recessed portions 74 penetrate the sealing resin 50. Further, the lands 38 are exposed to the bottom portions of the recessed portions 74. Even when the recessed portions 74 are formed, the thickness of the sealing resin 50 over the lands 38 is about 10 to 50 µm, and the grinded surface 50G and the surfaces of the lands 38 are substantially the same height.

(Rewiring Process)

Figure 25:
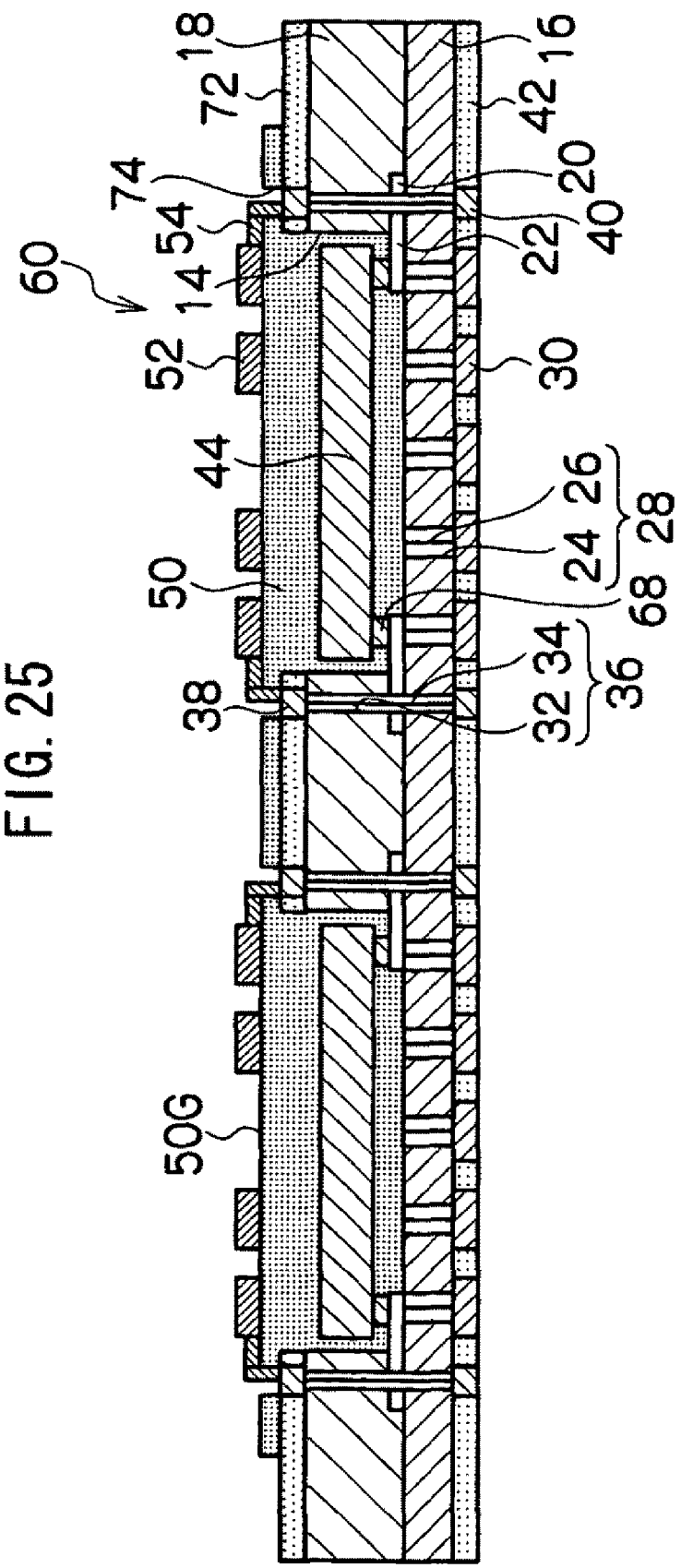
FIG. 25 is a partial cross-sectional diagram showing a rewiring process.

Next, rewiring is performed on the grinded surface 50G FIG. 25 is a partial cross-sectional diagram showing the rewiring process. The rewiring pads 52 and the wires 54 are formed in a predetermined pattern by metal nanoparticles on the grinded surface 50G exposed to the surface of the frame substrate 60. Because the surfaces of the lands 38 and the grinded surface 50G are formed in substantially the same height, formation of the rewiring pattern is easy. The rewiring pads 52 can be arranged (rewired) in an arbitrary layout such that connection to a package laminated on top becomes easy. The wires 54 are formed so as to interconnect the lands 38 and the rewiring pads 52 in a one-to-one ratio.

(Dicing Process)

Figure 26:
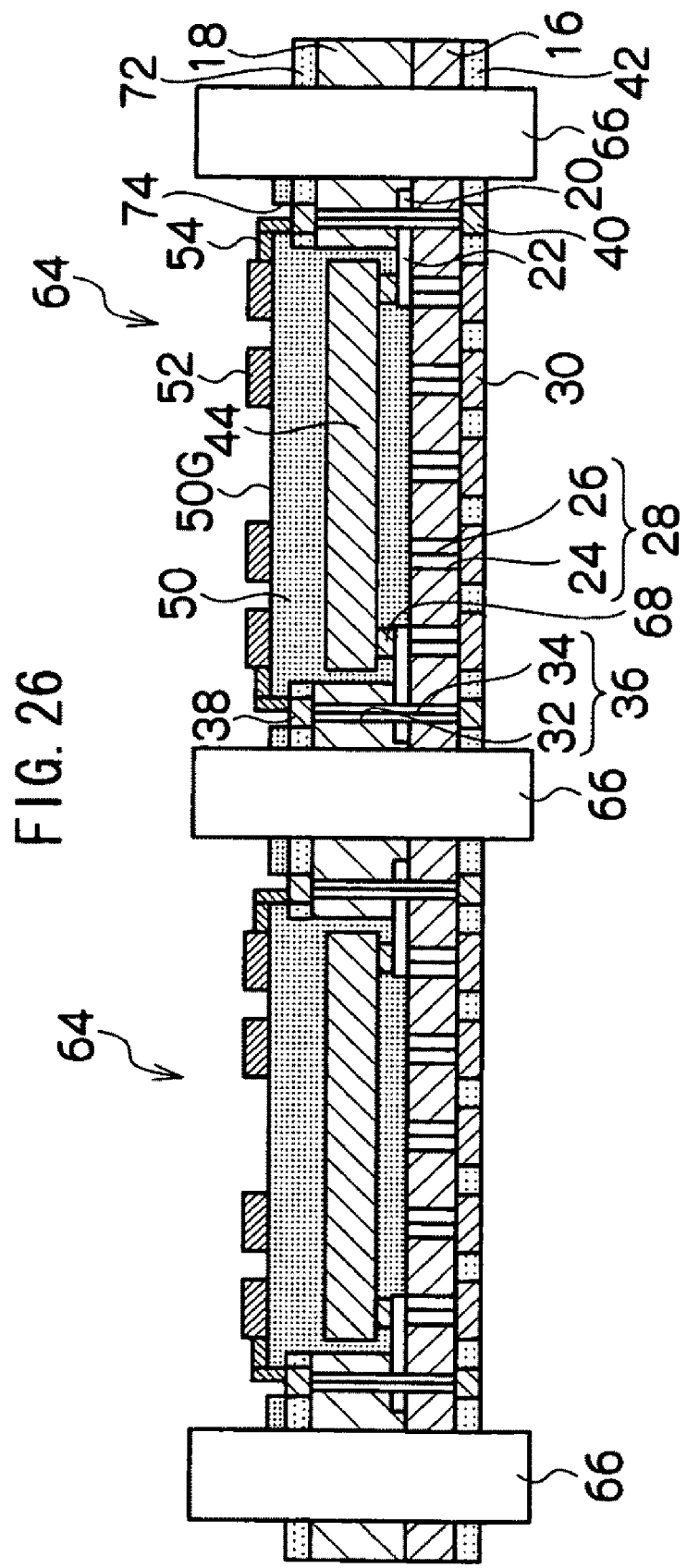
FIG. 26 is a partial cross-sectional diagram showing a dicing process.

Finally, the frame substrate 60 is diced to fragment the individual packages. FIG. 26 is a partial cross-sectional diagram showing the dicing process. Plural package structures 64 are formed on the frame substrate 60. Unillustrated blades are moved to saw-cut the frame substrate 60 in a grid-like manner and fragment the individual double-sided electrode package structures 64. Thus, the double-sided electrode packages 10C are completed. Further, blade passage regions 66 of the frame substrate 60 are removed by saw-cutting.

As described above, according to the present embodiment, the sealing resin that mold-seals the semiconductor chips is grinded from the surface side, whereby thinning of the double-sided electrode packages can be realized extremely easily. Further, because the semiconductor chips are flip-chip connected, the double-sided electrode package can be thinned even more.

Further, because the rewiring pads can be arranged (rewired) in an arbitrary layout, connection to a package laminated on top becomes easy. Further, because the surfaces of the lands and the grinded surface are formed in substantially the same height, formation of the rewiring pattern is easy.

Further, because the grinded surface is a rough surface, the grinded surface has excellent adhesion to the rewiring pattern. For this reason, it is difficult for wire breakage resulting from stripping of the rewiring pattern to occur.

Further, because the surfaces of the package substrates are covered by one type of resin (sealing resin), stripping of resin resulting from heat such as during reflow (soldering) when the substrates are packaged can be prevented. Thus, penetration of moisture into the insides of the packages and wire breakage resulting from stripping of the rewiring pattern can be prevented.

In the above-described third embodiment, the solder resist on the surface of the double-sided electrode package 10C is omitted, but the surface of the double-sided electrode package 10C may also be covered by a solder resist.

Other Embodiments

It will be noted that, in the above-described first to third embodiments, examples have been described where rewiring pads are formed on the surface of a double-sided electrode package and electrode pads are formed on the back surface of the double-sided electrode package, but connecting wires can also be formed on these pads. For example, a solder paste may be applied onto the pads to form a land grid array (LGA) type package, or solder balls may be disposed on the pads to form a ball grid array (BGA) type package.

Further, in the above-described first to third embodiments, examples have been described where the package substrate is configured by a tabular core material that is configured by an insulator and an insulating layer that is laminated on the core material, but the package substrate can also be configured by a multilayer-wired multilayer organic substrate. A multilayer organic substrate is a substrate where a wiring pattern is formed in each layer of a resin substrate comprising several layers (e.g., two to four layers) and via holes for interconnecting the wiring patterns of the respective layers are formed as needed. Conductor layers are formed inside these via holes, and these conductor layers are connected to lands that are end surface electrode portions formed on a lower surface side.

It will be noted that, in the above-described first to third embodiments, examples have been described where one semiconductor chip is housed in one double-sided electrode package, but plural semiconductor chips can also be housed in one double-sided electrode package.

What is claimed is:

1. A semiconductor device, comprising:
a semiconductor chip;
a package substrate that comprises, in a surface side thereof, a recessed portion in which the semiconductor chip is housed, with electrode pads that are electrically connected to electrodes of the semiconductor chip being formed inside the recessed portion;
a plurality of penetrating electrode portions disposed within the package substrate, each comprising a penetrating electrode that extends through the package substrate, and a terminal-use wire disposed on an end of a respective penetrating electrode and that is formed on a front surface of the package substrate and is electrically connected to a respective electrode pad;
external connection pads that are formed on a back surface of the package substrate and are electrically connected to the electrode pads;
a sealing resin portion that comprises a grinded surface that is parallel to the front surface of the package substrate and is formed by grinding, and seals at least the semiconductor chip by a sealing resin, an upper surface of the sealing resin portion being at a same level as an upper surface of the respective terminal-use wires and being at a level that is above a level of the front surface of the package substrate;
rewiring pads that are formed on the grinded surface of the sealing resin portion; and
connecting wires that are formed on the grinded surface of the sealing resin portion and electrically interconnect the terminal-use wires and the rewiring pads.

2. The semiconductor device of claim 1, wherein the sealing resin portion seals the semiconductor chip and the electrode pads by the sealing resin.

3. The semiconductor device of claim 2, wherein a sealing resin that has been molded so as to fill a gap between the recessed portion and the semiconductor chip and cover the front surface of the package substrate is grinded such that the grinded surface becomes parallel to the front surface of the package substrate, whereby the grinded surface is formed.

4. The semiconductor device of claim 3, wherein the sealing resin is grinded until the terminal-use wires are exposed, and the grinded surface and surfaces of the terminal-use wires are given the same height.

5. The semiconductor device of claim 3, wherein the sealing resin is grinded as far as the tops of the terminal-use wires, the front surface of the package substrate is covered by the sealing resin, and the sealing resin on the terminal-use wires is removed to expose the terminal-use wires.

6. The semiconductor device of claim 2, wherein an insulating film comprising an insulating material whose heat dissipating ability is higher than that of the sealing resin is formed on a back surface of the semiconductor chip.

7. The semiconductor device of claim 6, wherein a sealing resin that has been molded so as to fill a gap between the recessed portion and the semiconductor chip and cover the surfaces of the package substrate and the insulating film is grinded such that the grinded surface becomes parallel to the surface of the package substrate, whereby the grinded surface is formed.

8. The semiconductor device of claim 7, wherein the sealing resin is grinded until the terminal-use wires and the insulating film are exposed, and the grinded surface, surfaces of the terminal-use wires, and the surface of the insulating film are given the same height.

9. The semiconductor device of claim 1, wherein a sealing resin that has been molded so as to fill a gap between the recessed portion and the semiconductor chip and cover the front surface of the package substrate is grinded such that the grinded surface becomes parallel to the front surface of the package substrate, whereby the grinded surface is formed.

10. The semiconductor device of claim 9, wherein the sealing resin is grinded until the terminal-use wires are exposed, and the grinded surface and surfaces of the terminal-use wires are given the same height.

11. The semiconductor device of claim 9, wherein the sealing resin is grinded as far as the tops of the terminal-use wires, the front surface of the package substrate is covered by the sealing resin, and the sealing resin on the terminal-use wires is removed to expose the terminal-use wires.

12. The semiconductor device of claim 1, wherein an insulating film comprising an insulating material whose heat dissipating ability is higher than that of the sealing resin is formed on a back surface of the semiconductor chip.

13. The semiconductor device of claim 12, wherein a sealing resin that has been molded so as to fill a gap between the recessed portion and the semiconductor chip and cover the surfaces of the package substrate and the insulating film is grinded such that the grinded surface becomes parallel to the surface of the package substrate, whereby the grinded surface is formed.

14. The semiconductor device of claim 13, wherein the sealing resin is grinded until the terminal-use wires and the insulating film are exposed, and the grinded surface, surfaces of the terminal-use wires, and the surface of the insulating film are given the same height.

15. A method of fabricating a semiconductor device, the method, comprising:
  forming, in a frame substrate, a plurality of package substrate arrangements, each package substrate arrangement including:
    a package substrate, including
      a recessed portions in which a respective semiconductor chip is to be housed, and
      electrode pads that are disposed inside the recessed portion and that are electrically connected to electrodes of the respective semiconductor chip,
    a plurality of penetrating electrode portions that are disposed within the package substrate, each penetrating electrode portion comprising a penetrating electrode that extends through the package substrate, and a terminal-use wire disposed on an end of a respective penetrating electrode and that is formed on a front surface of the package substrate and is electrically connected to a respective electrode pad, and
    external connection pads that are formed on back surfaces of the package substrates and are electrically connected to the electrode pads;
  housing the semiconductor chips in the recessed portions per package;
  molding a sealing resin so as to fill gaps between the recessed portions and the semiconductor chips and cover the surfaces of the plurality of package substrates in order to seal the semiconductor chips by a sealing resin;
  grinding the sealing resin that has been molded to form a grinded surface that is parallel to the surfaces of the package substrates, and so that an upper surface of the sealing resin is at a same level as an upper surface of the respective terminal-use wires and at a level that is above a level of the front surface of the respective package substrates;
  forming rewiring pads per package on the grinded surface and forming connecting wires that electrically interconnect the terminal-use wires and the rewiring pads; and
  dicing the frame substrate where the semiconductor chips are housed per package and where the recessed portions, the electrode pads, the terminal-use wires, the external connection pads, the sealing resin, the rewiring pads and the connecting wires are formed per package to thereby divide the frame substrate into individual packages.

* * * * *